(12) United States Patent
Scheffers et al.

(10) Patent No.: US 9,665,014 B2
(45) Date of Patent: May 30, 2017

(54) CHARGED PARTICLE LITHOGRAPHY SYSTEM WITH ALIGNMENT SENSOR AND BEAM MEASUREMENT SENSOR

(71) Applicant: MAPPER LITHOGRAPHY IP B.V., Delft (NL)

(72) Inventors: Paul Ijmert Scheffers, Delft (NL); Jan Andries Meijer, Rotterdam (NL); Erwin Slot, Zoetermeer (NL); Vincent Sylvester Kuiper, The Hague (NL); Niels Vergeer, Rotterdam (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 181 days.

(21) Appl. No.: 14/383,569

(22) PCT Filed: Mar. 8, 2013

(86) PCT No.: PCT/EP2013/054723
§ 371 (c)(1),
(2) Date: Sep. 8, 2014

(87) PCT Pub. No.: WO2013/132064
PCT Pub. Date: Sep. 12, 2013

(65) Prior Publication Data
US 2015/0109601 A1    Apr. 23, 2015

Related U.S. Application Data

(60) Provisional application No. 61/608,513, filed on Mar. 8, 2012.

(51) Int. Cl.
*H01J 37/09*    (2006.01)
*H01J 37/16*    (2006.01)
(Continued)

(52) U.S. Cl.
CPC .............. *G03F 7/707* (2013.01); *B82Y 10/00* (2013.01); *B82Y 40/00* (2013.01);
(Continued)

(58) Field of Classification Search
CPC .. H01J 37/3177; H01J 37/3174; H01J 37/045; H01J 37/09; H01J 37/1477;
(Continued)

(56) References Cited

U.S. PATENT DOCUMENTS 4,465,934 A * 8/1984 Westerberg ......... G03F 7/70716
250/398
4,543,512 A * 9/1985 Nakasuji ................ B82Y 10/00
250/397

(Continued)

FOREIGN PATENT DOCUMENTS

CN    101158818    4/2008
CN    101487985    7/2009
(Continued)

*Primary Examiner* — David A Vanore
(74) *Attorney, Agent, or Firm* — Hoyng Monegier LLP; David P. Owen

(57) ABSTRACT

A multi-beamlet charged particle beamlet lithography system for transferring a pattern to a surface of a substrate. The system comprises a projection system (311) for projecting a plurality of charged particle beamlets (7) onto the surface of the substrate; a chuck (313) moveable with respect to the projection system; a beamlet measurement sensor (i.a. 505, 511) for determining one or more characteristics of one or more of the charged particle beamlets, the beamlet measurement sensor having a surface (501) for receiving one or more of the charged particle beamlets; and a position mark measurement system for measuring a position of a position mark (610, 620, 635), the position mark measurement system comprising an alignment sensor (361, 362). The chuck comprises a substrate support portion for supporting the substrate, a beamlet measurement sensor portion (460) for (Continued)

accommodating the surface of the beamlet measurement sensor, and a position mark portion (470) for accommodating the position mark.

18 Claims, 11 Drawing Sheets

(51) Int. Cl.
    *G03F 7/20*     (2006.01)
    *H01J 37/304*     (2006.01)
    *H01J 37/317*     (2006.01)
    *B82Y 10/00*     (2011.01)
    *B82Y 40/00*     (2011.01)

(52) U.S. Cl.
    CPC ...... *H01J 37/3045* (2013.01); *H01J 37/3177* (2013.01); *H01J 2237/1501* (2013.01); *H01J 2237/1502* (2013.01); *H01J 2237/3045* (2013.01)

(58) Field of Classification Search
    CPC ........ H01J 37/16; H01J 37/18; H01J 37/3045; G03F 7/70616; G03F 7/70775; G03F 7/7085; G03F 7/70291; G03F 7/70716; G03F 7/70816; G03F 9/7088; G03F 9/7023; G03F 9/7096
    USPC ......... 250/398, 492.2, 396 R, 492.22, 492.3, 250/492.1, 492.23, 397, 216, 227.11, 250/396 ML, 443.1, 492.24, 503.1; 355/67, 72, 53, 71, 77
    See application file for complete search history.

(56) References Cited

U.S. PATENT DOCUMENTS

| | | | |
|---|---|---|---|
| 5,912,469 A * | 6/1999 | Okino | B82Y 10/00 250/396 R |
| 6,897,458 B2 | 5/2005 | Wieland et al. | |
| 6,958,804 B2 * | 10/2005 | Wieland | B82Y 10/00 355/53 |
| 7,019,908 B2 | 3/2006 | van 't Spijker et al. | |
| 7,084,414 B2 * | 8/2006 | Wieland | B82Y 10/00 250/492.1 |
| 7,129,502 B2 | 10/2006 | Kruit | |
| 7,709,815 B2 | 5/2010 | Jager et al. | |
| 7,842,936 B2 | 11/2010 | Kruit et al. | |
| 8,089,056 B2 * | 1/2012 | Wieland | B82Y 10/00 250/398 |
| 8,254,484 B2 | 8/2012 | Kim et al. | |
| 8,586,949 B2 * | 11/2013 | Dinu-Gurtler | B82Y 10/00 250/396 R |
| 8,921,758 B2 * | 12/2014 | Wieland | B82Y 10/00 250/216 |
| 9,383,662 B2 * | 7/2016 | Vergeer | G03F 9/7088 |
| 2002/0067473 A1 | 6/2002 | Deguchi et al. | |
| 2003/0122091 A1 * | 7/2003 | Almogy | B82Y 10/00 250/492.24 |
| 2005/0072939 A1 | 4/2005 | Sohda et al. | |
| 2005/0253093 A1 * | 11/2005 | Gorski | B82Y 10/00 250/492.22 |
| 2007/0057204 A1 | 3/2007 | Kruit et al. | |
| 2007/0064213 A1 | 3/2007 | Jager et al. | |
| 2009/0261267 A1 | 10/2009 | Wieland et al. | |
| 2011/0073782 A1 | 3/2011 | Wieland | |
| 2011/0079739 A1 * | 4/2011 | Schiavone | F04B 49/065 251/129.01 |
| 2011/0253900 A1 | 10/2011 | Hanfoug et al. | |
| 2012/0268725 A1 * | 10/2012 | De Boer | G03F 9/7088 355/72 |

FOREIGN PATENT DOCUMENTS

| | | |
|---|---|---|
| EP | 2 397 906 A2 | 12/2011 |
| JP | 2005 347054 A | 12/2005 |
| WO | WO 2004 038509 A2 | 5/2004 |
| WO | WO 2007 032670 A1 | 3/2007 |
| WO | WO 2011 080311 A1 | 7/2011 |

* cited by examiner

CHARGED PARTICLE LITHOGRAPHY SYSTEM WITH ALIGNMENT SENSOR AND BEAM MEASUREMENT SENSOR

BACKGROUND OF THE INVENTION

1. Field of the Invention

The invention relates to a multi-beamlet charged particle lithography system and a method for transferring a pattern to a surface of a substrate, and more particularly relates to a lithography system having an alignment sensor and beam measurement sensor and a method of using the system.

2. Description of the Related Art

In the semiconductor industry, an ever increasing desire exists to manufacture smaller structures with high accuracy and reliability. Charged particle lithography is a promising technology to meet the high demands. In this type of lithography charged particles are manipulated to transfer a onto a target surface of a substrate, typically a wafer.

Lithographic processing generally involves exposure of multiple layers on top of each other so that features formed in subsequent layers may be connected so as to create an integrated circuit. Therefore a pattern to be exposed in a later exposure session is to be aligned with the one or more patterns that were created earlier in a sufficiently accurate manner. A position difference between a pattern in one layer and a pattern in a previously patterned layer on the same substrate is referred to as overlay.

To control overlay in a multi-beam charged particle exposure apparatus, such as a lithography apparatus, the relationship between the substrate to be exposed and the charged particle radiation is determined. For this purpose alignment marks are present on substrates to be processed. However, it is not possible to determine the relationship between the substrate to be processed and the charged particle radiation, or the projection system used to project such radiation onto the substrate in a direct way. Consequently, multiple measurements are needed which take valuable time.

A sensor for measuring properties of a large number of charged-particle beamlets, in particular for charged particle beamlets used in a lithography system, is described in US published patent application 2007/057204 assigned to the present applicant, the content of which is herewith incorporated by reference in its entirety.

US 2007/057204 describes a sensor and method in which charged-particle beamlets are converted into light beams, using a converter element such as a fluorescent screen or a doped YAG material. Subsequently, the light beams are detected by an array of light sensitive detectors such as diodes, CCD or CMOS devices. A relatively fast measurement can be achieved by reading out a large number of light sensitive detectors in a single operation. Additionally, the sensor structure, in particular the array of light detectors, enables a very small pitch of a multiplicity of beams to be measured without the necessity of unduly large structural measures in the region of the stage part of a lithography system.

However, in view of the continuously increasing demands of the industry regarding small dimensions without loss of throughput, there remains a need to provide even more accurate devices and techniques for measurement of beamlet properties in lithography systems, particularly in lithography machines comprising a large number of charged-particle beamlets that are designed to offer a high throughput.

BRIEF SUMMARY OF THE INVENTION

It is an object of the present invention to provide a multi-beamlet charged particle exposure system in which the alignment of a substrate and the radiation used for patterning the substrate can be performed in a relatively easy and fast manner. For this purpose, the present invention provides a multi-beamlet charged particle beamlet lithography system for transferring a pattern to a surface of a substrate. The system comprises a projection system for projecting a plurality of charged particle beamlets onto the surface of the substrate; a chuck moveable with respect to the projection system; a beamlet measurement sensor for determining one or more characteristics of one or more of the charged particle beamlets, the beamlet measurement sensor having a surface for receiving one or more of the charged particle beamlets; and a position mark measurement system for measuring a position of a position mark, the position mark measurement system comprising an alignment sensor. The chuck comprises a substrate support portion for supporting the substrate, a beamlet measurement sensor portion for accommodating the surface of the beamlet measurement sensor, and a position mark portion for accommodating the position mark.

The surface of the beamlet measurement sensor for receiving the charged particle beamlets preferably has a predetermined spatial relationship with the position mark. Furthermore, the surface of the beamlet measurement sensor and the position mark may be combined into a single structure. For example, the position mark may be formed on the surface of the beamlet measurement sensor. The surface of the beamlet measurement sensor and the position mark may be fixed to a surface of the chuck, e.g. the beamlet measurement sensor surface and the position mark may be mounted directly onto the top or side surface of the chuck, or may be fixed via mounting hardware to the top or side surface.

The alignment sensor may comprise a light source for illuminating the position mark and a detector for detecting light that has interacted by reflection with the position mark. The light may be in or outside the visible spectrum.

The surface of the beamlet measurement sensor for receiving the beamlets may comprise a converter element for receiving charged particles and generating photons in response. The beamlet measurement sensor may further comprise a photon receptor arranged to detect photons generated by the converter element and generate a signal in response. The converter element may be attached to the chuck facing the projection system, and the photon receptor positioned underneath the chuck away from the projection system. The chuck may have a hole to permit passage of photons generated by the converter element towards the photon receptor.

The surface of the beamlet measurement sensor for receiving the charged particle beamlets may be provided with a predetermined pattern of one or more charged particle blocking structures forming one or more knife edges at transitions between blocking and non-blocking regions. These knife edges may be used for creating variations in a signal generated by the beamlet measurement sensor when a charged particle beamlet is scanned over one of the knife edges. The predetermined pattern of one or more charged particle blocking structures may have a predetermined spatial relationship with the position mark.

The surface of the beamlet measurement sensor for receiving the charged particle beamlets may be further provided with a predetermined pattern of light blocking structures forming the position mark. These light blocking structures are suitable to be detected by the alignment sensor, e.g. having a different height or different reflectivity from the remaining portion of the surface, so that the alignment sensor can detect the height difference or different reflectivity to determine the location of the light blocking structures. Alternatively or additionally, a predetermined pattern of one or more charged particle blocking structures may form the position mark, e.g. if these charged particle blocking structures also constitute light blocking structures. In this way, the pattern of blocking structures performs two functions, the pattern being detectable by the alignment sensor and functioning as part of the beamlet measurement sensor.

A certain feature or portion of the predetermined pattern of one or more charged particle blocking structures may be arranged to coincide with a certain feature or portion of the position mark. For example, the geometric center of the pattern of charged particle blocking structures may be arranged to coincide with the geometric center of the position mark. The predetermined (two-dimensional) pattern of one or more charged particle blocking structures may comprise a plurality of blocking structures positioned at a pitch corresponding to an expected distance between adjacent charged particle beamlets at the substrate surface. The one or more charged particle blocking structures may be formed having various shapes, such as substantially circular blocking structures.

The known spatial relationship between the surface of the beamlet measurement sensor for receiving the charged particle beamlets and the position mark (e.g. between the charged particle blocking structures of the beamlet measurement sensor and the light blocking structures of the position mark) enables the system to correlate measurements taken using the beamlet measurement sensor and measurements taken using the position mark measurement system. For example, measurements of beamlet position made by the beamlet measurement sensor (e.g. when beamlets cross one or more of the knife edges formed by charged particle blocking structures) and measurements of chuck position taken when the beamlet position measurements are made, can be used to establish a relationship between beamlet position and chuck position. The beamlet position may be the position of a single beamlet, or a reference point of a group of beamlets or all the beamlets. For example a geometric center of a group of beamlets may be used as a reference point.

Measurements of chuck position taken when the alignment sensor of the position mark measurement system is in a certain position with respect to the position mark (e.g. when light reflected by light blocking structures of the position mark indicates a certain alignment of the chuck with respect to the alignment sensor) can be used to establish a relationship between chuck position and the alignment sensor position. The alignment sensor position may be a reference point of the alignment sensor, e.g. the position of a light beam projector of the alignment sensor.

Together, these two relationships enable calculation of beamlet position relative to the alignment sensor. This is significant due to variations in relative position of the beamlets and the alignment sensor due to effects such as thermal expansion of the structure holding the alignment sensors and final lens elements, drift of the beamlets, etc. The alignment sensor can be used to determine position marks on the substrate, to then enable accurate positioning of the beamlets with respect to the substrate and patterns previously formed on the substrate.

The position mark measurement system may comprise a first alignment sensor for determining a position of the position mark in a first direction and a second alignment sensor for determining a position of the position mark in a second direction, the second direction being perpendicular or nearly perpendicular to the first direction. The position mark may comprise periodic or alternating structures in a first direction, and periodic or alternating structures in a second direction, the second direction being perpendicular or nearly perpendicular to the first direction. This arrangement of the structures of the position mark may correspond to a same arrangement of the first and second alignment sensors. The periodic or alternating structures may be formed by (periodically) spaced elevated structures, and they may be formed by regions with a first reflectivity coefficient alternating with regions with a second reflectivity coefficient, the second reflectivity coefficient being different from the first reflectivity coefficient.

The projection system may comprise a beamlet generator for generating the plurality of charged particle beamlets, and a modulation system for modulating the charged particle beamlets in accordance with a pattern to be transferred to the surface of the substrate, wherein the projection system is arranged for projecting the modulated beamlets onto the surface of the substrate.

The system may further comprise a chuck position measuring system and a control unit. The control unit may be arranged to move the chuck to a first position at which one or more of the charged particle beamlets are received by the surface of the beamlet measurement sensor; measure one or more characteristics of the one or more charged particle beamlets received by the surface of the beamlet measurement sensor; measure position of the chuck in the first position to determine a first measured chuck position; move the chuck to a second position at which the position mark is aligned with the alignment sensor; measure position of the chuck in the second position to determine a second measured chuck position; and calculate a relative position between the one or more charged particle beamlets and the alignment sensor on the basis of the measurement of the one or more characteristics of the one or more charged particle beamlets, the first measured chuck position, and the second measured chuck position.

The control unit may be further arranged to move the chuck, the chuck having a substrate placed on the substrate supporting portion of the chuck, to a third position at which a substrate position mark on the substrate is aligned with the alignment sensor; and measure position of the chuck in the third position to determine a third measured chuck position. And the control unit may be still further arranged to move the chuck to a fourth position at which one or more of the charged particle beamlets expose a desired portion of the substrate to be exposed, the fourth position being determined on the basis of the measurement of the one or more characteristics of the one or more charged particle beamlets and the first, second and third measured chuck positions.

In another aspect, the invention relates to a method for operating the multi-beam charged particle lithography system as described above, the method comprising moving the chuck to a first position at which one or more of the charged particle beamlets are received by the surface of the beamlet measurement sensor; measuring one or more characteristics of the one or more charged particle beamlets received by the surface of the beamlet measurement sensor; measuring position of the chuck in the first position to determine a first measured chuck position; moving the chuck to a second position at which the position mark is aligned with the alignment sensor; measuring the position of the chuck in the second position to determine a second measured chuck position; and calculating a relative position between the one or more charged particle beamlets and the alignment sensor on the basis of the measurement of the one or more characteristics of the one or more charged particle beamlets, the first measured chuck position, and the second measured chuck position. The second position may be a position at which a particular feature or portion of the position mark is aligned under a particular part of the alignment sensor, e.g. the (geometric) center of the position mark may be aligned under the beam of the alignment sensor. Or the alignment of the position mark and alignment sensor may be approximate, e.g. sufficient to allow the alignment sensor to read at least a portion of the position mark. The method step of calculating the relative position between the one or more charged particle beamlets and the alignment sensor may comprise calculating a vector distance between a reference point of the one or more charged particle beamlets and a reference point of the alignment sensor.

The method may further comprise placing a substrate on the substrate supporting portion of the chuck; moving the chuck to a third position at which a substrate position mark on the substrate is aligned with the alignment sensor; and measuring the position of the chuck in the third position to determine a third measured chuck position. The step of placing a substrate on the substrate supporting portion of the chuck may be performed before beginning the procedure, e.g. before moving the chuck to the first position, or it may be performed at a later time but before the step of moving the chuck to the third position. The method may still further comprise moving the chuck to a fourth position at which one or more of the charged particle beamlets expose a desired portion of the substrate to be exposed, the fourth position being determined on the basis of the measurement of the one or more characteristics of the one or more charged particle beamlets and the first, second and third measured chuck positions.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
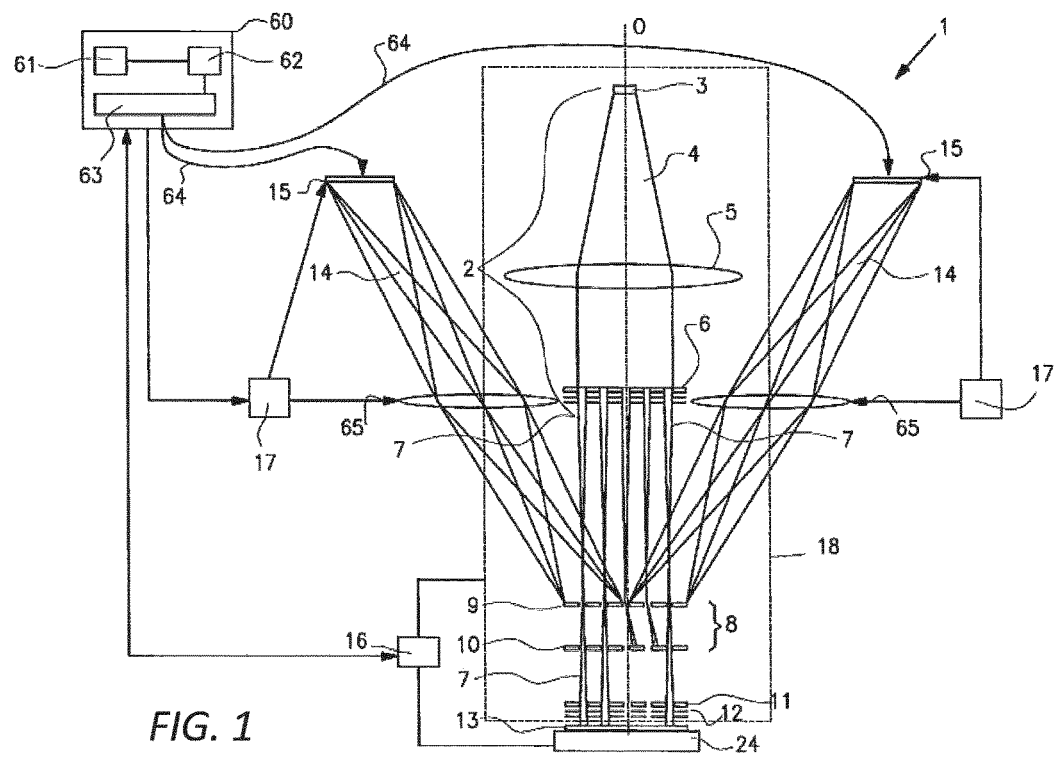
FIG. 1 schematically shows an example of a multi-beam charged particle lithography system.

FIG. 1 shows a simplified schematic drawing of an embodiment of a charged particle multi-beamlet lithography system 1. Such lithography system is for example described in U.S. Pat. Nos. 6,897,458; 6,958,804; 7,019,908; 7,084,414; 7,129,502; 7,709,815; 7,842,936; 8,089,056 and 8,254,484; U.S. patent application publication nos. 2007/0064213; 2009/0261267; US 2011/0073782; US 2011/0079739 and US 2012/0091358, which are assigned to the applicant of the present application and which are hereby incorporated by reference in their entirety.

Such lithography system 1 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about −1 to −10 kV with respect to the target at ground potential, although other settings may also be used.

In FIG. 1, the electron beam 4 from the electron source 3 passes a collimator lens 5 for collimating the electron beam 4. The collimator lens 5 may be any type of collimating optical system. Before collimation, the electron beam 4 may pass a double octopole (not shown).

Subsequently, the electron beam 4 impinges on a beam splitter, in the embodiment of FIG. 1 an aperture array 6. The aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 60. The control unit 60 may comprise a data storage unit 61, a read out unit 62 and data converter 63. The control unit 60 may be located remote from the rest of the system, for instance outside the inner part of a clean room. Using optical fibers 64, modulated light beams 14 holding pattern data may be transmitted to a projector 65 which projects light from the ends of fibers within a fiber array (schematically depicted as plate 15) into the electron optical portion of the lithography system 1, schematically denoted by the dashed box and reference number 18.

In the embodiment of FIG. 1, the modulated light beams are projected on to the beamlet blanker array 9. More particularly, the modulated light beams 14 from optical fiber ends are projected on corresponding light sensitive elements located on the beamlet blanker array 9. The light sensitive elements may be arranged to convert the light signal into a different type of signal, for example an electric signal. A modulated light beam 14 carries a portion of the pattern data for controlling one or more blankers that are coupled to a corresponding light sensitive element. Suitably, in order to project the light beams 14 onto corresponding light sensitive elements optical elements such as a projector 65 may be used. Additionally, to allow projection of the light beams 14 at a suitable incident angle, a mirror may be included, for example suitably placed between a projector 65 and the beamlet blanker array 9.

The projector 65 may be appropriately aligned with the plate 15 by a projector positioning device 17 under control of the control unit 60. As a result, the distance between the projector 65 and the light sensitive elements within the beamlet blanker array 9 may vary as well.

In some embodiments, the light beams may, at least partially, be transferred from the plate towards the light sensitive elements by means of an optical waveguide. The optical waveguide may guide the light to a position very close to the light sensitive elements, suitably less than a centimeter, preferably in the order of a millimeter away. A short distance between an optical waveguide and a corresponding light sensitive elements reduces light loss. On the other hand, the use of plate 15 and a projector 65 located away from the space that may be occupied by the charged particle beamlets has the advantage that the beamlet disturbance is minimized, and the construction of the beamlet blanker array 9 is less complex.

The modulated beamlets coming out of the beamlet modulator are projected as a spot onto a target surface 13 of a target 24 by the beamlet projector. The beamlet projector typically comprises a scanning deflector for scanning the modulated beamlets over the target surface 13 and a projection lens system for focusing the modulated beamlets onto the target surface 13. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface 13 positioned at a target plane. For lithography applications, the target usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface 13.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface 13.

In some embodiments, a beam protector (not shown) may be located between the target surface 13 and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface 13 is correct, while the deflector array 11 may ensure by appropriate scanning operations that the position of a pixel on the target surface 13 is correct on a microscale. Particularly, the operation of the deflector array 11 is such that a pixel fits into a grid of pixels which ultimately constitutes the pattern on the target surface 13. It will be understood that the macroscale positioning of the pixel on the target surface 13 is suitably enabled by a wafer positioning system present below the target 24.

Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Figure 2:
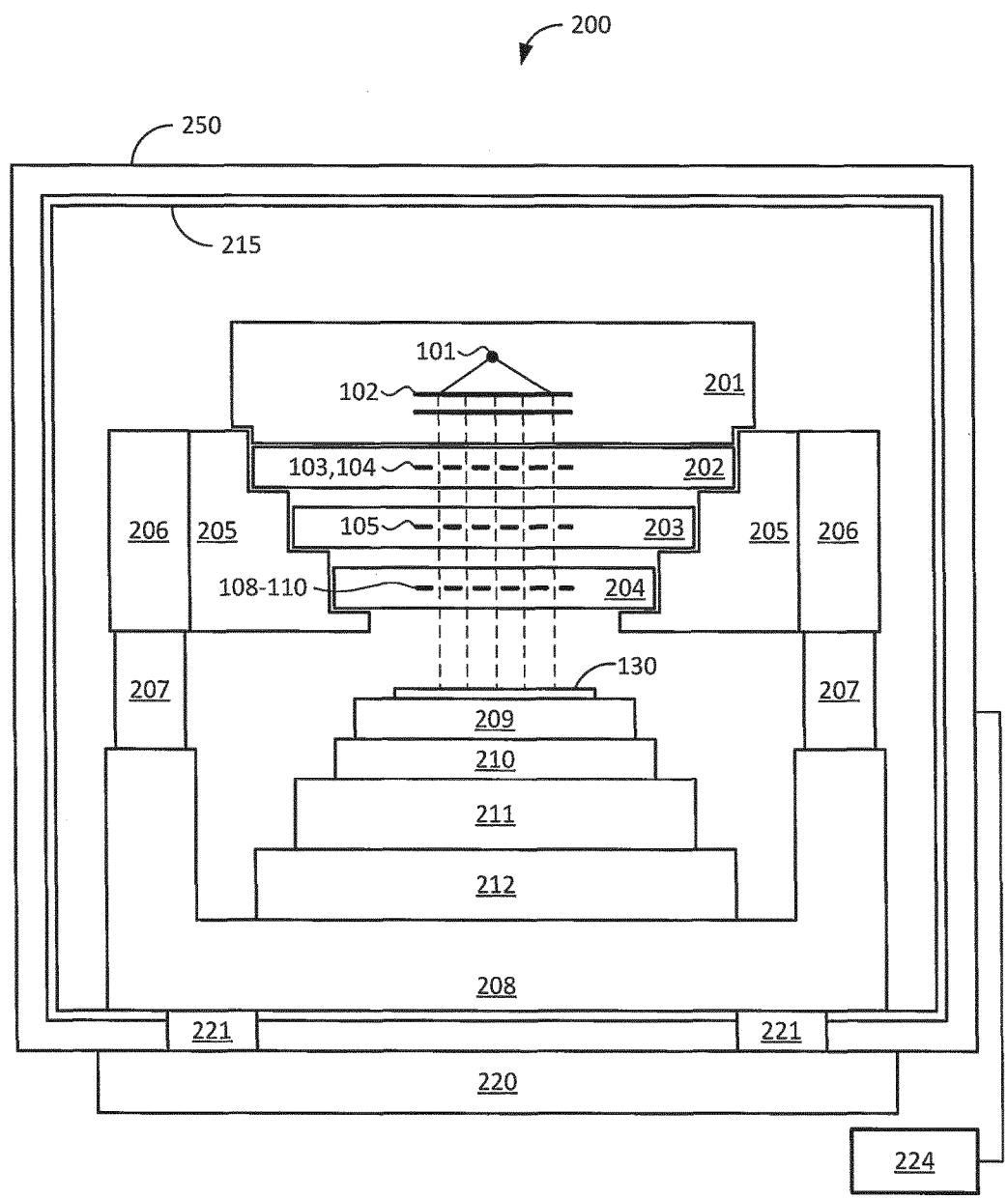
FIG. 2 shows a simplified block diagram of a modular lithography system.

FIG. 2 shows a simplified block diagram of a modular lithography system. The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 2, these modular subsystems include an illumination optics module 201 including a charged particle beam source 101 and a beam collimating system 102, an aperture array and condenser lens module 202 including an aperture array 103 and a condenser lens array 104, a beam switching module 203 including a beamlet blanker array 105, and a projection optics module 204 including a beam stop array 108, a beam deflector array 109, and projection lens arrays 110. The modules may be designed to slide in and out from an alignment frame. In the embodiment shown in FIG. 2, the alignment frame comprises an alignment inner sub-frame 205 and an alignment outer sub-frame 206. As will be discussed with reference to FIG. 3 the projection optics module 204 may be connected to at least one of the alignment inner sub-frame 205 and the alignment outer sub-frame by means of one or more flexures.

The above-mentioned components in the illumination optics module 201, the aperture array and condenser lens module 202, the beam switching module 203 and the projection optics module 204 may be arranged to operate in correspondence to the functionality of similar components with respect to the lithography system 1 of FIG. 1.

In the embodiment of FIG. 2, a frame 208 supports the alignment sub-frames 205 and 206 via vibration damping mounts 207. In this embodiment, a wafer 130 rests on a wafer table 209, which is in turn mounted on further supporting structure 210. The combination of wafer table 209 and further supporting structure 210 may hereafter also be referred to as chuck 210. The chuck 210 sits on the stage short stroke 211 and long stroke 212. The lithography machine is enclosed in vacuum chamber 250, which preferably includes a mu metal shielding layer or layers 215. The machine rests on a base plate 220 supported by frame members 221.

Each module may require a large number of electrical signals and/or optical signals, and electrical power for its operation. The modules inside the vacuum chamber receive these signals from one or more control systems 224, which are typically located outside of the chamber. The vacuum chamber 250 includes openings, referred to as ports, for admitting cables carrying the signals from the control systems into the vacuum housing while maintaining a vacuum seal around the cables. Each module preferably has its collection of electrical, optical, and/or power cabling connections routed through one or more ports dedicated to that module. This enables the cables for a particular module to be disconnected, removed, and replaced without disturbing cables for any of the other modules. In some embodiments, a patch panel may be provided within the vacuum chamber 250. The patch panel comprises one or more connectors for removably connecting one or more connections of the modules. One or more ports may be used for admitting the one or more connections of the removable modules into the vacuum chamber.

Figure 3:
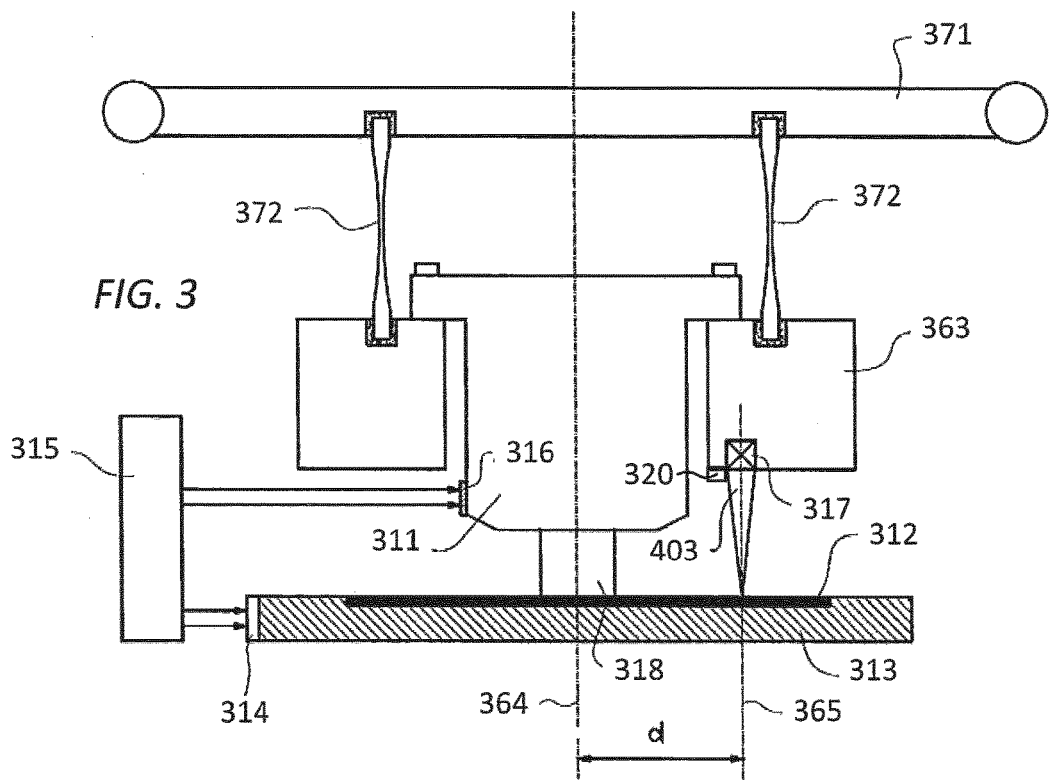
FIG. 3 schematically shows a portion of a lithography system that may be used in embodiments of the invention.

FIG. 3 schematically shows of a portion of a multi-beam charged particle exposure apparatus that may be used in embodiments of the invention. In particular, FIG. 3 shows a projection system 311 positioned above a substrate support structure, further referred to as chuck 313.

The projection system 311 is arranged for receiving a patterning beam 318 and directing the patterning beam 318 towards a surface. The patterning beam 318 is arranged to illuminate an area on the surface referred to herein as the 'beam grid'. Where the patterning beam 318 comprises a plurality of charged particle beamlets 7, the beamlets are preferably directed to spots on the surface arranged in a grid formation to form the beam grid. In order define the position and orientation of the beam grid with respect to a surface, such as the substrate surface 312, an origin or reference point of the beam grid may be defined, for example as the nominal focal position of a reference beam positioned at the least-squares grid fit through all beamlets of the beam 318.

The surface may be a surface 312 of a substrate to be exposed, such as a wafer, placed on the chuck 313. Alternatively, or additionally, such surface may be a measuring surface of a beamlet measurement sensor that is, at least partially, connected to, and preferably integrated into, the chuck 313. Preferably, the chuck 313 is controllably movable with respect to the projection system 311, for example by using one or more suitable actuators that are communicatively coupled to a control unit.

The projection system 311 is supported by a support 363. In the embodiment of FIG. 3, the support 363 is connected to a frame 371 via a number of flexures 372, preferably three. By using at least three flexures 372 the position of the support 363 may be well defined in space. The flexures 372 may comprise a resilient material. The flexures 372 may be glued in recesses in the support 363, as schematically shown in FIG. 3. Additionally, the flexures 372 may limit the transfer of external forces that operate on the frame 371 towards the support 363. This allows the frame 371 to comprise a high thermal expansion material, such as aluminum. The use of aluminum would make the frame 371 relatively light-weighted.

The chuck position may be determined by a chuck position measuring system. In FIG. 3 the chuck position measuring system comprises one or more interferometers 315. However, as will be known to a person skilled in the art, other position sensors, as well as additional position sensors, may be used as well. The differential interferometer 315 of FIG. 3 comprises a chuck position mirror 314 connected to the chuck 313 and a projection system position mirror 316 connected to the projection system 311. The differential interferometer 315 is arranged to detect or measure movements of the chuck 313 with respect to the projection system 311. The chuck position sensor system may comprise more than one differential interferometer 315 to detect the position of the chuck 313 with respect to the projection system 311 in more than one direction. Multiple non-differential interferometers may also be used to measure position of the chuck 313.

The exposure apparatus of FIG. 3 further comprises a position mark measurement system 317 for detecting and/or measuring a position mark. Generally, such position mark is provided on a surface, for example a surface of the chuck 313 or attached to the chuck, or a surface of a substrate 312 to be processed. Hereinafter, reference may be made to a chuck position mark if the mark is provided on a surface of the chuck 313. Additionally, reference may be made to a wafer position mark if the mark is positioned on a substrate 312 to be processed.

In some embodiments, the support 363 is provided with a height measurement system 320 arranged for measuring the distance between the alignment sensors 361, 362 and the surface. The height measurement system may be a capacitive height measurement system comprising one or more capacitive sensors. The height measurement system may be integrated into the alignment sensors 361, 362 or may be separate. One or more suitable actuators for controlling movement of the chuck 313 may be arranged for changing the distance between the alignment sensors 361, 362 and the surface. A control unit, such as processing unit 224 in FIG. 2, may be arranged for receiving information about the distance from the height measurement system 320 and provide movement information to one or more actuators to make any desirable adjustments in view of the measured distance.

Figure 4:
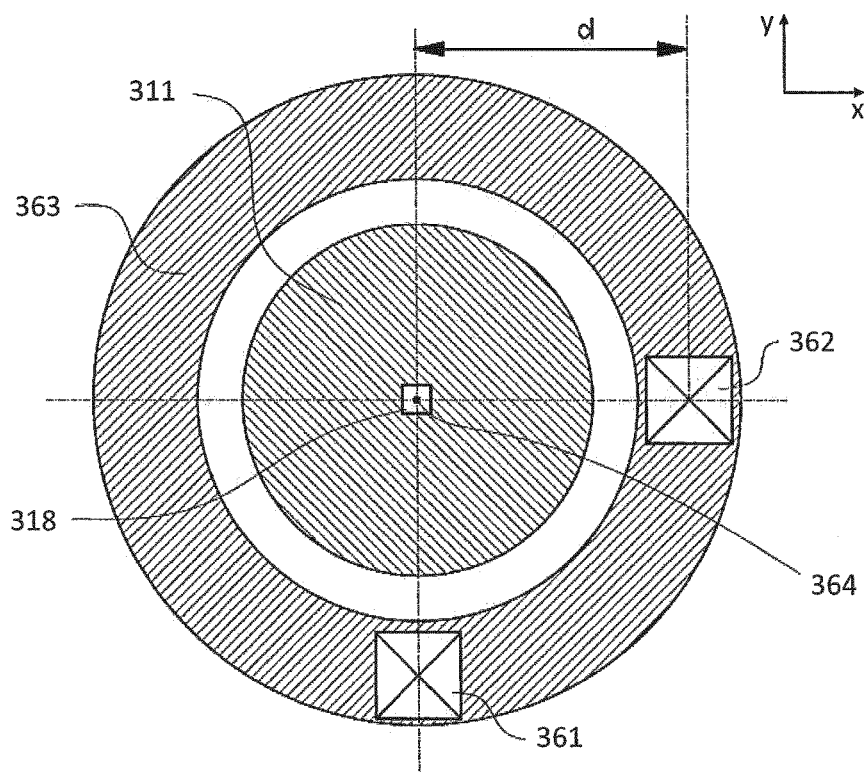
FIG. 4 schematically shows a part of a cross-section of the lithography system portion of FIG. 3.

FIG. 4 schematically shows a part of a cross-section of an embodiment of the lithography system portion of FIG. 3 showing projection system 311, e.g. the final element of a projection lens for focusing a patterning beam 318 onto the substrate 313. In this embodiment, the position mark measurement system 317 of FIG. 3 comprises a first alignment sensor 361 and a second alignment sensor 362. The first alignment sensor 361 is arranged to detect the position of a position mark in the y-direction. The second alignment sensor 362 is arranged to detect the position of a position mark in the x-direction. Both alignment sensors 361, 362 may comprise a light source for illuminating the position mark and a detector for detecting light that interacted by reflection with the position mark.

Reference number 318 refers to the patterning beam, the center of which is denoted by dot 364. The alignment sensors 361, 362 may be mounted onto a support 363 that is also responsible for supporting the projection system 311, as can be seen in FIG. 3. In this embodiment, the support 363 is ring-shaped.

It may be understood from FIGS. 3 and 4 that an expansion of the projection system 311 in a radial direction, e.g. due to thermal expansion, could lead to an expansion of the support 363. However, the position of the beam 318 does not necessarily change in the same way, or may not even change at all. To reduce variation of the distance between the position of the beam 318 and the alignment sensors 361, 362, the support 363 is preferably made of a low thermal expansion material, such as glass-ceramic, Pyrex and/or Zerodur.

Figure 5:
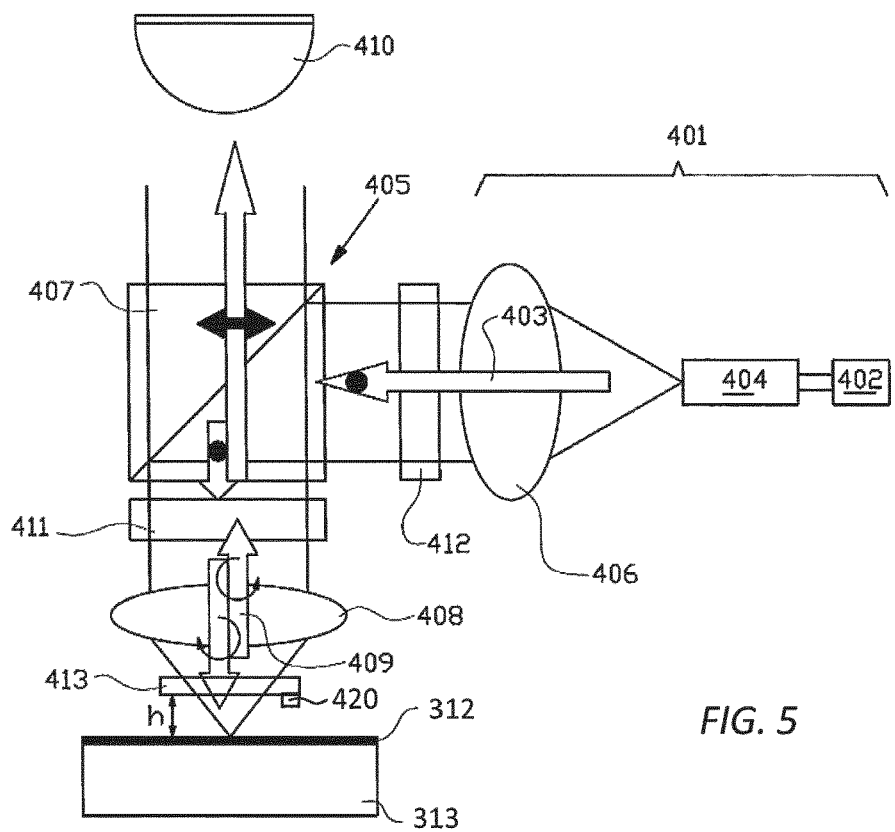
FIG. 5 schematically shows an embodiment of an alignment sensor.

FIG. 5 schematically shows an embodiment of an alignment sensor, such as alignment sensor 361 or 362 in FIG. 4. The alignment sensor comprises a light source 401 for providing a light beam 403 and a light intensity detector 410. Preferably, the alignment sensor further comprises an optical system 405 for improvement of the alignment sensor performance.

The light source comprises a light generator 402, such as a laser, arranged for providing light of a predetermined wavelength, for example a wavelength in the range of 600-650 nm. The light source 401 may comprise an optical fiber 404 for guiding the light generated by the light generator 402 towards the optical system 405. Some embodiments of the light source 401 include a collimator lens 406 for collimating the light beam 403 that is generated by the light generator 402.

The optical system 405 of the alignment sensor of FIG. 2 comprises a beam splitter 407 and a focus lens 410. The beam splitter 407 is arranged for directing the light beam 403 towards the position mark located on a surface of a body of interest, in FIG. 5 a substrate surface 312 located on a chuck 313. The focus lens 408 is arranged for focusing the light beam 403 onto the surface 312. The light beam 403 reflects on the position mark on the surface 312 which results in a reflected light beam 409. The beam splitter 407 may then direct the reflected light beam 409 towards the light intensity detector 410.

The light intensity detector 410 may comprise a photodiode or an un-biased silicon PIN diode working in photovoltaic mode. This mode may lower the amount of heat being generated with respect to a biased mode operation of a photodiode. The light intensity detector 410 may also comprise an operational amplifier to convert a current from the photodiode into a voltage. Such voltage may be filtered. The filtered voltage may then be converted to a digital signal, that may be used by a processing unit, for example the processing unit of the lithography system the alignment sensor is part of. The active area of the light intensity detector 410 may be smaller than the diameter of the reflected light beam 409 leaving the beam splitter 407. Therefore, the optical system 405 may comprise a further focus lens positioned between the beam splitter 407 and the light intensity detector 410 to focus the reflected light beam 409 on the active area of the light intensity detector 410. As a result, all energy within the reflected light beam 409 that leaves the beam splitter 407 may be used by the light intensity detector 410.

In a non-polarizing beam splitter it may be the case that 50% of the alignment light beam 403 is directed towards the surface 312, while the other 50% may be lost. Additionally, only 50% of the reflected alignment light beam 409 may be directed to the light intensity detector 410, while the other 50% may be lost. Consequently, 75% of the alignment light beam 403 may not used for the position detection.

Therefore, a polarizing beam splitter 407 may be used in an embodiment of the alignment sensor. In that case, the light source 401 may provide a polarized alignment light beam 403. The light source 401 may comprise a polarizer, such as a polarizing filter 412, arranged for transforming a non-polarized light beam into a polarized light beam. Alignment light beam 403 may be a S-polarized light beam, which is indicated in FIG. 5 by a dot.

The polarizing beam splitter 407 may be arranged for guiding the S-polarized alignment light beam towards the surface. The optical system may further comprise a quarter wave plate 411, which may be located between the polarizing beam splitter 407 and the focus lens 408. When the alignment light beam 403 travels through the quarter wave plate 411, it may change its polarization from S-polarization into a right circular polarization, as is indicated by a curved arrow in FIG. 5. When the alignment light beam 403 is reflected by the surface 312, polarization may change again: the reflected alignment light beam 409 may have a left circular polarization, as is indicated by another curved arrow in FIG. 5. When the reflected alignment light beam 409 travels through the quarter wave plate 411, it may change its polarization from left circular polarization into a P-polarization which is indicated by a straight arrow in FIG. 5. Polarizing beam splitter 407 may be arranged to guide the P-polarized reflected alignment light beam towards the light intensity detector 410.

The use of a polarized alignment light beam, a polarized reflected alignment light beam and a polarizing beam splitter may result in a reduction of stray light, back reflection and energy loss in the beam splitter 407. Furthermore, the polarizing filter 412 may be arranged to minimize reflection of light back into the light source 401.

In an embodiment of the alignment sensor, the focus lens 408 is arranged to focus alignment light beam 403 on surface 312 in cooperation with a transparent plate 413, which may refract both the alignment light beam 403 and the reflected alignment light beam 409. The refraction depends on the material of the transparent plate 413.

A height measurement system 420 may be provided to measure the distance h between the alignment sensor and the surface 312 and/or the tilt of the height measurement system 420 or the alignment sensor with respect to the surface 312. The height measurement system 420 may be an optical height measurement system or a capacitive height measurement system. The capacitive height measurement system may be a differential capacitive height measurement system.

With information about the distance h between the alignment sensor and the surface and/or the tilt of the alignment sensor with respect to the surface 312, the distance h and/or the tilt may be adapted to obtain or maintain the desired distance and/or tilt.

In an embodiment, one or more suitable actuators for controlling movement of the chuck 313 may be arranged for changing the distance h and/or the tilt. A control unit, such as processing unit 224 in FIG. 2, may be arranged for receiving information about the distance and/or tilt from the height measurement system 420 and provide movement information to one or more actuators to make any desirable adjustments in view of the distance and/or tilt information.

Figure 6:
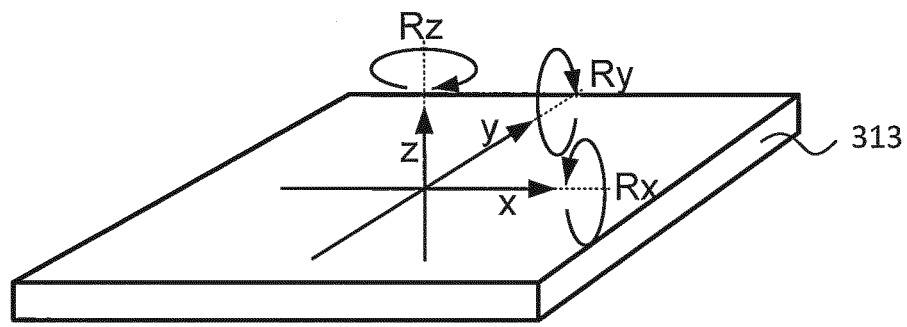
FIG. 6 schematically shows one possible definition of dimensions in a lithography system.

FIG. 6 schematically shows one possible definition of dimensions in a lithography system with reference to the chuck 313, showing x, y and z directions and Rx, Ry and Rz rotational directions. In this shown arrangement, movement in the x-direction represents a horizontal translation of the chuck, in the y-direction a horizontal translation of the chuck perpendicular to the x-direction, and in the z-direction a vertical translation of the chuck, perpendicular to the x- and y-directions. Movement in the Rx-direction represents a rotation of the chuck about the x-axis, in the Ry-direction a rotation of the chuck about the y-axis, and in the Rz-direction a rotation of the chuck about the z-axis.

The arrows in FIG. 6 indicate a definition of the sign for each direction, i.e. positive movement. A direction opposite to the arrows may then be defined as a negative movement in that direction. Embodiments of the invention are described according to a coordinate system that corresponds to this definition, although other definitions may be used to describe the measurement and movement directions described herein. Furthermore, the definition of directions depicted in FIG. 6 may be used for different coordinate frames for the lithography system. For example, as is the case in FIG. 6, the definition may be used to define a chuck coordinate frame for defining the position and movements of the chuck 313. This coordinate frame may be referred to as chuck coordinate frame and positions within this coordinate frame may be referred to as being defined in chuck coordinates.

Alternatively, the definition of directions depicted in FIG. 6 may be used for defining a target coordinate frame for defining the position and movements of a target, such as substrate 313.

In yet another alternative, the definition of directions depicted in FIG. 6 may be used for defining a beam grid coordinate frame for defining the position of a beam grid of multiple beamlets, and the origin or reference point of such a beam grid, such as patterning beam 318. The x-axis of the beam grid would then, for example, run through the origin and parallel to the rows of beamlets on the beam grid, while the y-axis would run through the origin and perpendicular to the x-axis. A z-axis may then be defined as an axis running through the origin and being perpendicular to the focal plane of the patterning beam 318.

A coordinate frame of the position measurement system 317, e.g. having coordinates [x, y, z, Rx, Ry, Rz], may refer to coordinates [x, y, z] of a chuck coordinate frame positioned at the origin of the beam grid of beam 318, while rotations [Rx, Ry, Rz] of the chuck 313 measured by the position measurement system 317 may be determined with respect to the beam grid coordinate frame.

Figure 7:
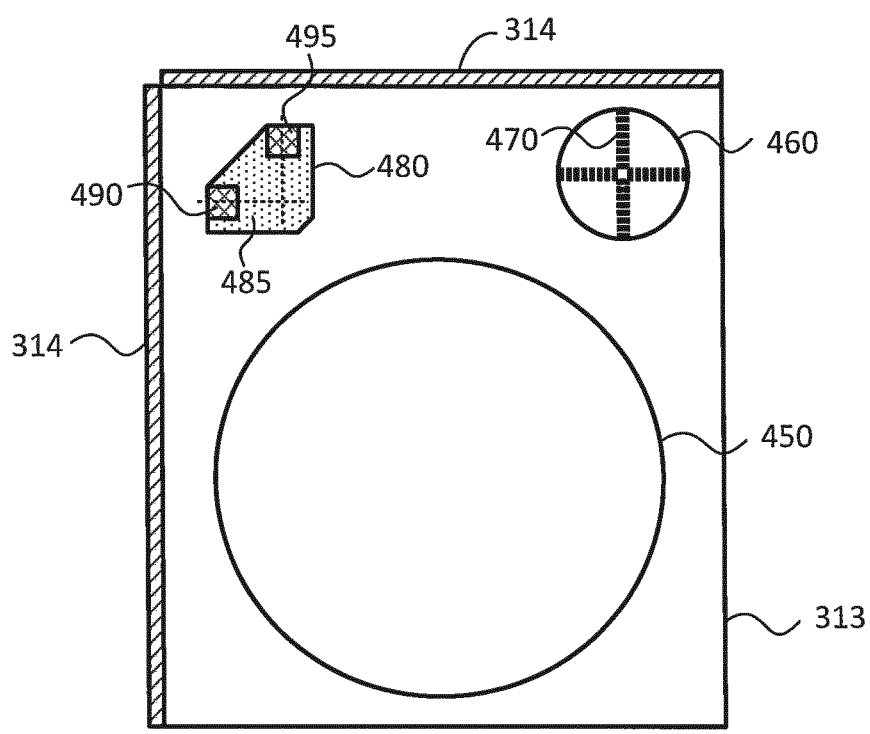
FIG. 7 shows a schematic top view of a chuck that may be used in the lithography system portion of FIG. 3.

FIG. 7 schematically shows a top view of the chuck 313 that may be used in the lithography system portion of FIG. 3. The chuck 313 comprises a substrate supporting portion 450 that is used for supporting a substrate 312 to be patterned, for example a wafer. The chuck 313 further comprises a beamlet measurement sensor portion 460 for accommodating, at least a portion of, a beamlet measurement sensor for detecting one or more beamlet parameters. The beamlet measurement sensor portion 460 may support or have affixed a surface 501 of a beamlet measurement sensor 500 for receiving charged particle beamlets. Further details with respect to an embodiment of a beamlet measurement sensor will be discussed with reference to FIGS. 8, 9a, 9b and 12. The chuck also comprises a position mark portion 470 for accommodating, e.g. supporting or having affixed to it, a position mark 610, 620, 635. Further details with respect to embodiments of a position mark will be discussed with reference to FIGS. 10a, 10b, 11 and 12. The position mark portion 470 is depicted on the beamlet measurement sensor portion 460 in the embodiment of FIG. 7, although these may alternatively be located in separate areas of the chuck 313.

Preferably, the chuck 313 is also provided with a reference plate 480 which comprises a surface 485 and reference chuck position marks 490, 495. The reference chuck position marks 490, 495 are preferably arranged at nominally the same separation as the separation between the first and second alignment sensors 361, 362, and preferably in the same spatial arrangement. The reference chuck position marks 490, 495 may be 2-dimensional marks, e.g. for reading and alignment in the x- and y-directions. Another option is to use differently oriented 1-dimensional reference chuck position marks 490, 495. Further details with respect to the use of a reference plate 480 will be discussed with reference to FIGS. 14a, 14b.

Figure 8:
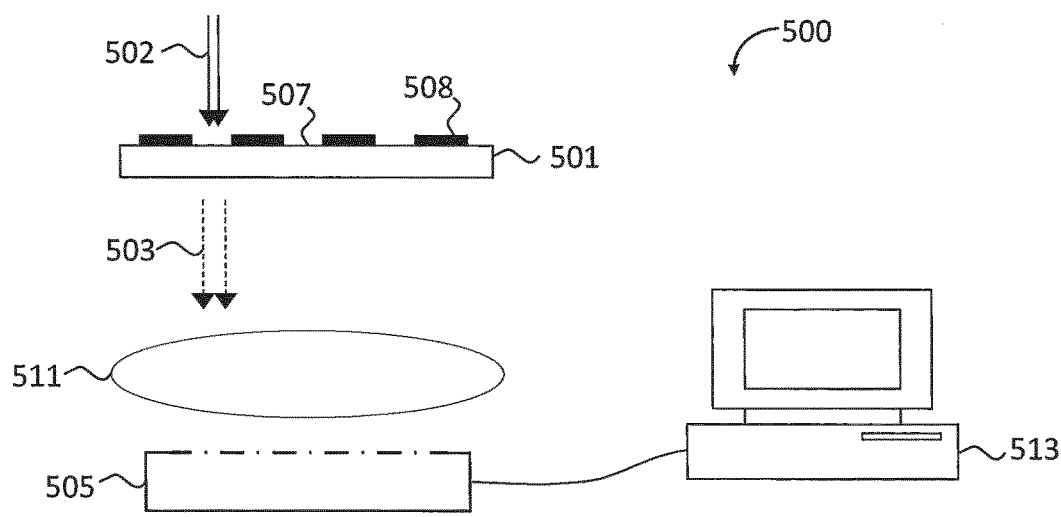
FIG. 8 schematically shows an embodiment of a sensor for determining one or more characteristics of charged particle beamlets.

FIG. 8 schematically shows the operation of a sensor 500 for determining one or more characteristics of charged particle beamlets. The sensor comprises a surface 501 for receiving the charged particle beamlets, which in this embodiment comprises a converter element. The surface 501 is provided with a pattern comprising charged particle blocking structures 508 and charged particle transmissive regions 507, further referred to as non-blocking regions. The converter element 501 is arranged for receiving charged particles 502 and using the energy of the received charged particles to generate photons 503. The photons 503 may be directed towards a photon receptor 505 by means of an optical system 511. The photon receptor 505 is communicatively coupled to a calculation unit, e.g. a computer 513 for determining one or more characteristics of the charged particles 502.

The converter element of surface 501 may take the form of a fluorescent element, for example a fluorescent screen, or a scintillating element, for example a substrate of a doped yttrium aluminum garnet (YAG) material. Hereafter, embodiments of the invention will be described in which a YAG-screen is used as the converter element 501, where the YAG-screen may be referred to as YAG 501.

The photon receptor 505 may include any suitable light sensitive detector, such as a plurality of diodes, charged coupled device (CCD) cameras or complementary metal-oxide semiconductor (CMOS) cameras. Hereafter, the photon receptor 505 may be referred to as camera 505.

Although embodiments of the invention may be used for any type of charged particles 502, hereafter, embodiments of the invention will be discussed with reference to electrons.

In electron beamlet devices where the beamlet size is in the nanometer range, for example electron microscopes, electron beam lithography apparatus, and electron beam pattern generators, direct observation of photons created by conversion by the converter element 501 is insufficient to enable determination of characteristics such as position of an electron beamlet as the resolution is limited by the wavelength of the converter element 501.

To improve accuracy, an electron beamlet may be scanned across an electron blocking structure provided with sharp edges, further referred to as knife edges. An example of a sensor using a converter element provided with a knife edge is described in patent application US 2007/057204, which is herewith incorporated by reference in its entirety.

Figure 9A:
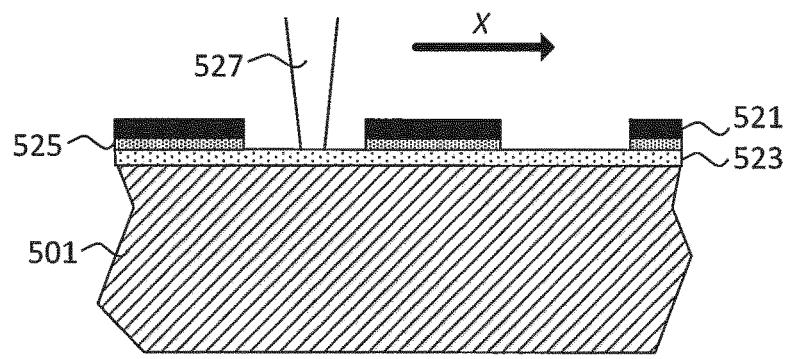
FIG. 9a schematically shows a cross-section of a converter element provided with a charged particle blocking structure pattern.

FIG. 9a schematically shows a cross-section of a YAG 501 comprising an electron beamlet receiving surface provided with an electron blocking structure. The electron blocking structure comprises electron blocking regions provided with a layer 521 capable of blocking electrons. The blocking layer 521 may be a metal layer. A suitable metal for blocking electrons is tungsten. In between the blocking regions are non-blocking regions. An electron beamlet 527 impinging onto a non-blocking region of the electron blocking structure actually impinges onto the surface of the YAG 501 or a coating on the surface of the YAG 501.

Within the portions for blocking electrons, besides the blocking layer 521 an additional layer 525 may be present. The additional layer 525 may be a metal layer, and may serve the purpose of increasing the edge sharpness of the blocking layer 521. This is achieved by choosing an additional layer material that is resistant to the blocking layer etching process. When tungsten is chosen as the blocking layer material, a suitable material for the additional layer 525 is chrome.

The YAG 501 may be coated with a conducting coating layer 523 for preventing of charging of the YAG 501 as a result of the incoming charged particle beamlets, for example in electron beamlet 527. Alternatively, or additionally, the coating layer 523 is used for blocking background radiation, in particular ambient light with a wavelength similar to the light that is generated by the YAG 501 in response to the receipt of charged particles such as electrons. Suitable materials for the coating layer 523 include aluminum and titanium.

As mentioned earlier, in order to determine the position of an electron beamlet 527, the electron beamlet 527 may be scanned over a blocking structure provided on the YAG 501 (in FIG. 9A in a direction denoted as X-direction). In response, light generated within the YAG 501 may be detected by a camera. An exemplary result of such scanning and detection action is schematically depicted in FIG. 9b.

Figure 9B:
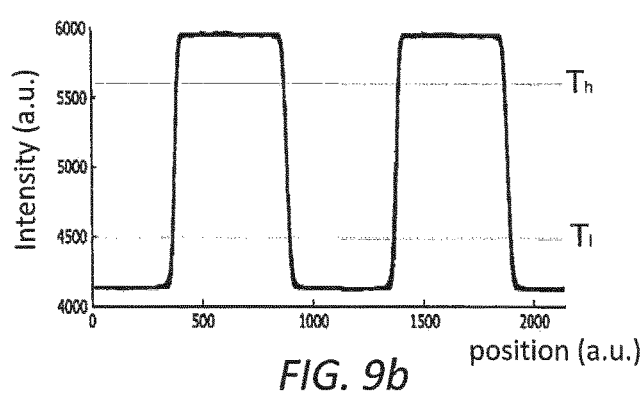
FIG. 9b shows an exemplary graph representing intensity of light emitted by a converter element as a function of the position of a charged particle beamlet.

FIG. 9b shows a graph representing intensity of light emitted by a converter element such as YAG 501 as a function of x-position of an electron beamlet over the surface of the converter element. A maximum response is observed when the electron beamlet is entirely positioned in a non-blocking region, and minimal light is generated if the electron beamlet is positioned entirely on top of a blocking structure. The crossing of a knife edge results in a steep change of light intensity.

Knowledge of the knife edge pattern provided on the electron-receiving surface of the converter element surface allows for the determination of beamlet characteristics such as beamlet position and beamlet spot size, where the spot size relates to the size of the beamlet on the surface of the YAG 501.

The beamlet position can be measured by scanning the beamlet across the surface of the converter element in the x-direction and measuring the position at which the intensity of light emitted by a converter element changes from a maximum to a minimum value or from a minimum to a maximum value, as shown in FIG. 9b. For example, when the intensity changes from maximum to minimum value, this indicates that the beamlet is scanned over a knife edge transitioning from a non-blocking region to a blocking region in the x direction.

The beamlet spot size can be determined by measuring the distance between a point at which the intensity starts to decrease from a maximum value and the point at which the intensity reaches a minimum value as the beamlet is scanned across a knife edge. This indicates the distance over which the beamlet is partly blocked and partly un-blocked. Similarly, the beamlet size can be determined by measuring the time between sensing a maximum intensity and sensing a minimum intensity as the beamlet is scanned across a knife edge, and multiplying by the scanning speed of the beamlet. These measurements can also be performed on the opposite knife edge, the beamlet moving from minimum to maximum intensity.

Note that the measurement shown in FIG. 9b relates to a beamlet having dimensions that are smaller than the widths of the blocking and non-blocking regions involved. These dimensions and widths are taken along a direction parallel to the scan direction being used.

A chip design generally comprises multiple patterned layers, which means that the same substrate has to be patterned multiple times, i.e. one or more sessions per layer. Between a first and a second session of providing a pattern, it may be required to remove the substrate from the lithography system. In that case, it may be required that the pattern position of the second session matches with the pattern position of the first session. This so-called overlay-requirement can be met by using position marks on the substrate that can be detected with an position mark measurement system. This procedure may be sufficiently accurate if all the substrate layers to be patterned are patterned in the same lithography system under the assumption that the vector distance between the position mark measurement system detecting the one or more substrate position marks and the beam grid does not change significantly over time. However, if multiple lithography systems are used for patterning the substrate layers, or in case of a modular lithography system such as the system shown in FIG. 2, if a different projection optics module is used, the vector distance between the position mark measurement system and the plurality of patterning beamlets may well vary significantly per layer.

It is not possible to measure the relation between the charged particle beamlets and the substrate directly. However, the inventors of this invention realized that such relation may be established using a beamlet measurement sensor 500 and a position mark measurement system 317 comprising one or more alignment sensors 361, 362 as described above. In addition, the converter element surface 501 of the beamlet measurement sensor 500 may be provided with a two-dimensional pattern that can be used by the beamlet measurement sensor and with a two-dimensional pattern that can be used by the position mark measurement system.

To achieve sufficiently accurate overlay, the inventors realized that it is important to be able to reproduce the beam grid-to-position mark measurement system vector at any position of the chuck, i.e. to be able to reproduce a relative position of the beamlets on the substrate surface and the chuck position. This reproducibility is much more complex if the chuck rotates in between different alignment sensor measurements or between beam sensor measurements and alignment sensor measurements. To keep the scenario as simple as possible, the Rx, Ry and Rz position of the chuck 313 may be fixed for all position mark measurement system and beamlet sensor measurements.

Figure 10A:
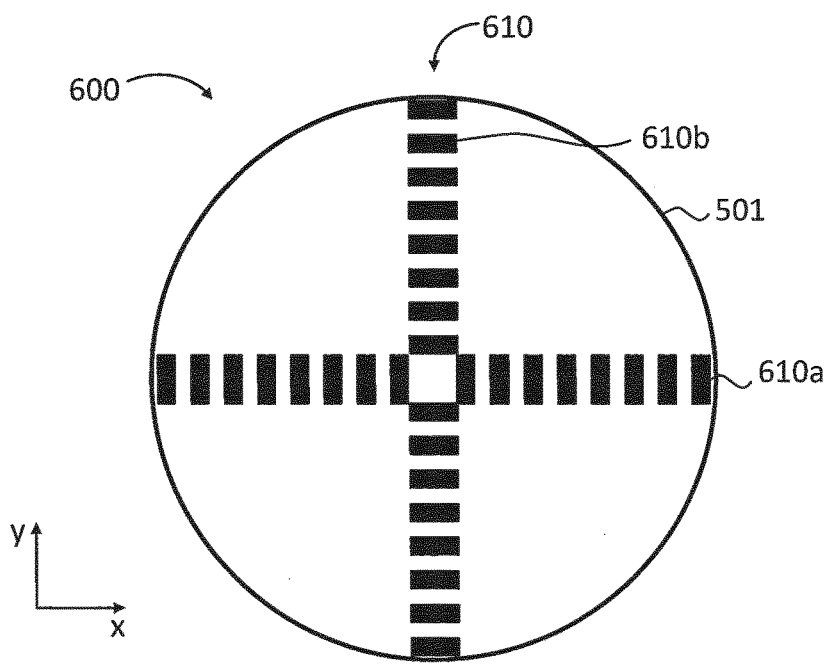
FIG. 10a shows a schematic top view of a two-dimensional pattern of charged particle blocking structures within the beamlet measurement sensor that may be used in embodiments of the invention.

FIG. 10a shows a schematic top view of an arrangement 600 of two-dimensional pattern 610 of charged particle blocking structures 610a, 610b provided on a portion of the converter element 501 of the beamlet measurement sensor 500 that may be used in embodiments of the invention. The pattern 610 may be provided on the beamlet measurement sensor portion 460 on the chuck 313. The two-dimensional pattern forms one or more knife edges at transitions between blocking and non-blocking regions. As explained with reference to FIGS. 8, 9a and 9b, characteristics of one or more charged particle beamlets, such as their position, may be determined by suitably scanning the beamlets over the two-dimensional pattern 610 and evaluating the light generated by the converter element 501 in response.

The two-dimensional pattern of charged particle blocking structures 610a, 610b is further shaped in such a way that it can be used as a chuck position mark. This may for example be established by making sure that the two-dimensional pattern 610 of charged particle blocking structure results in areas with different height levels or different reflectivity, or with another suitable property that makes them distinguishable by the alignment sensor(s) (note, two-dimensional in this context does not signify that the structures cannot also have different heights).

For example, the charged particle blocking structures 610a, 610b may provide one or more additional layers on top of the converter element surface 501, resulting in a height difference between the top surface of the blocking structures 610a, 610b and the surface 501 of the converter element not covered by the blocking structures. Consequently, light originating from an alignment sensor such as alignment sensor 361 or alignment sensor 362 that impinges on the charged particle blocking structures travels along a smaller trajectory, and thus reflects earlier, than light that impinges on the areas not covered by the charged particle blocking structures. If the two-dimensional pattern 610 takes the form of a periodic structure a phase grating may be created. In another example, the top surface of the charged particle blocking structures 610a, 610b has a different reflectivity coefficient for the wavelength used by the alignment sensor than the surface 501 of the converter element not covered by the charged particle blocking structures. Consequently, light originating from an alignment sensor such as alignment sensor 361 or alignment sensor 362 that impinges on the charged particle blocking structures 610a, 610b reflects in a different fashion, than light that impinges on the areas not covered by the charged particle blocking structures. If the pattern takes the form of a periodic structure a reflection amplitude grating may be created.

The two-dimensional pattern 610 shown in FIG. 10a comprises two gratings 610a, 610b, for example phase gratings or reflection amplitude gratings. The grating 610a may be used to align the chuck position mark 610 with respect to an alignment sensor for measuring the x-position, e.g. alignment sensor 362 in FIG. 3. Similarly, the grating 610b may be used to align the position mark with respect to an alignment sensor for measuring the y-position, e.g. alignment sensor 361 in FIG. 3.

Figure 10B:
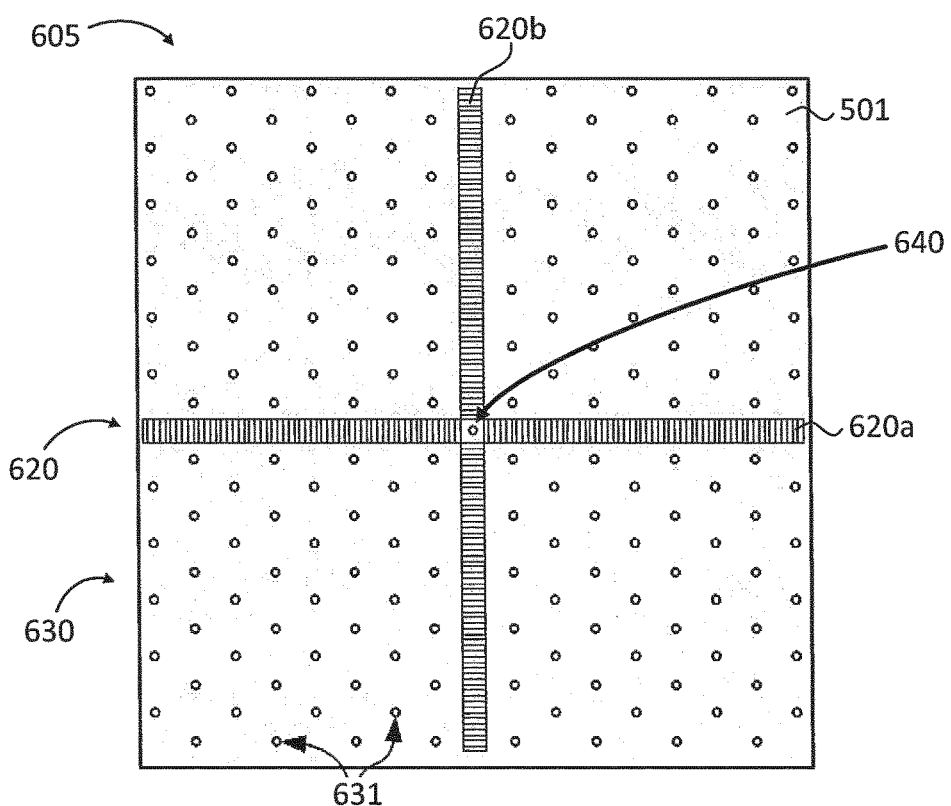
FIG. 10b shows a schematic top view of a pattern provided on a sensor surface of a beamlet measurement sensor that may be used in embodiments of the invention.

FIG. 10b shows a schematic top view of another arrangement 605 of a two-dimensional pattern provided on a portion of the converter element 501 of the beamlet measurement sensor 500 that may be used in other embodiments of the invention. The pattern comprise a two-dimensional pattern 620 forming a chuck position mark detectable by an alignment sensor, and a two-dimensional pattern 630 of charged particle blocking structures 631.

The pattern 620 forming a chuck position mark comprises a grating 620a and a grating 620b. The gratings 620a, 620b may be phase gratings, reflection amplitude gratings or any other gratings known to a person of skill in the art suitable for use with an alignment sensor. The grating 620a may be used to align the chuck position mark with respect to an alignment sensor for measuring the x-position, e.g. alignment sensor 362 in FIG. 3. Similarly, the grating 620b may be used to align the position mark with respect to an alignment sensor for measuring the y-position, e.g. alignment sensor 361 in FIG. 3.

The pattern 630 of charged particle blocking structures comprises a plurality of circular blocking structures 631. Preferably, the circular blocking structures 631 are positioned with a pitch corresponding to an expected or theoretical distance between adjacent charged particle beamlet at the surface of the converter element of the beamlet measurement sensor 500. In that case, each beamlet may be scanned over a corresponding circular blocking structure 630 to identify one or more relevant beamlet parameters, such as beamlet position. Although uniformly-sized circular blocking structures 631 are shown in the drawing, the structures may have varying size and shapes other than circular structures may be used.

When different portions of the pattern on surface 501 are used for the alignment sensor(s) and the beamlet measurement sensor, it is preferred that the pattern 620 forming the chuck position mark and the pattern 630 of charged particle blocking structures 631 have a predetermined spatial relationship with each other. Knowing the predetermined spatial relationship enables correlation of measurements made by the alignment sensor(s) and the beam measurement system, and may improve the speed at which a relative position between the beam grid and the position mark measurement system can be determined.

Preferably, the spatial relationship between the two patterns 620, 630 is such that the center of the chuck position mark coincides with geometric center of the two-dimensional pattern of blocking structures. The geometric center of the pattern of blocking structures may be defined as the position at which the sum of the squares of the distances towards all surrounding blocking structures is minimal. The geometric center of the two-dimensional pattern of blocking structures in FIG. 10*b* is denoted by reference number 640.

Instead of a plurality of blocking structures, a charged particle blocking layer with a plurality of apertures may be used.

Figure 11:
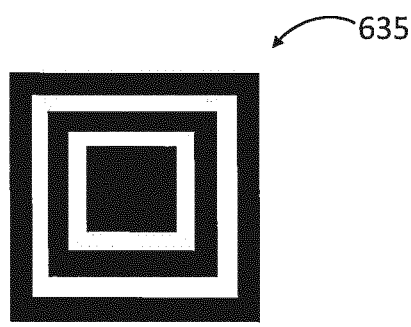
FIG. 11 shows a schematic top view of charged particle blocking structure provided on a sensor surface of a beamlet measurement sensor that may be used in embodiments of the invention.

FIG. 11 shows a schematic top view of a charged particle blocking structure 635 provided on a sensor surface 501 of a beam measurement sensor that may be used in embodiments of the invention. In particular, a plurality of charged particle blocking structures 635 may be used instead of the circular blocking structures 631 shown in FIG. 10*b*. The charged particle blocking structure 635 forms multiple knife edges at transitions between blocking and non-blocking regions within the blocking structure 635. A charged particle beamlet being scanned over the charged particle blocking structure 635 generally passes more knife edge transitions than it would if scanned over a substantially circular structure such as structure 631. As a result, the position of the beamlet may be determined with more accuracy.

Figure 12:
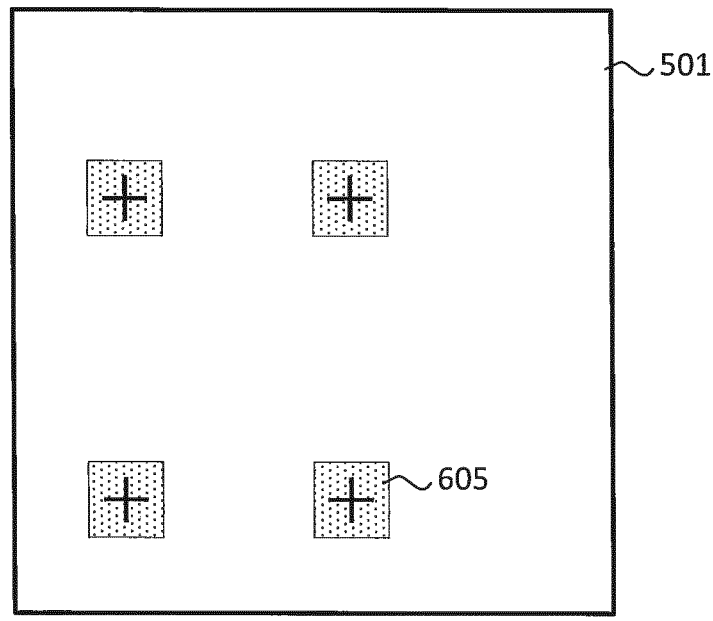
FIG. 12 shows a schematic top view of the entire beamlet measurement sensor portion on the chuck comprising multiple regions that include the two-dimensional pattern shown in FIG. 10b.

The structures shown in FIGS. 10*b* and 11 may not cover the entire beamlet measurement sensor surface portion 460 but merely cover a region of that surface 460. FIG. 12 shows a schematic top view of the entire beamlet measurement sensor portion 460 on the chuck 313 comprising four regions 605 which include the two-dimensional pattern shown in FIG. 10*b*. The use of multiple regions 605 improves the reliability of the measurement. For example, if one of the regions 605 is contaminated, the another region 605 may be used. Furthermore, measurements obtained within multiple regions 605 may improve the accuracy of the alignment. Furthermore, some regions 605 may have different dimensions than others to create the possibility to determine scaling parameters.

Figure 13:
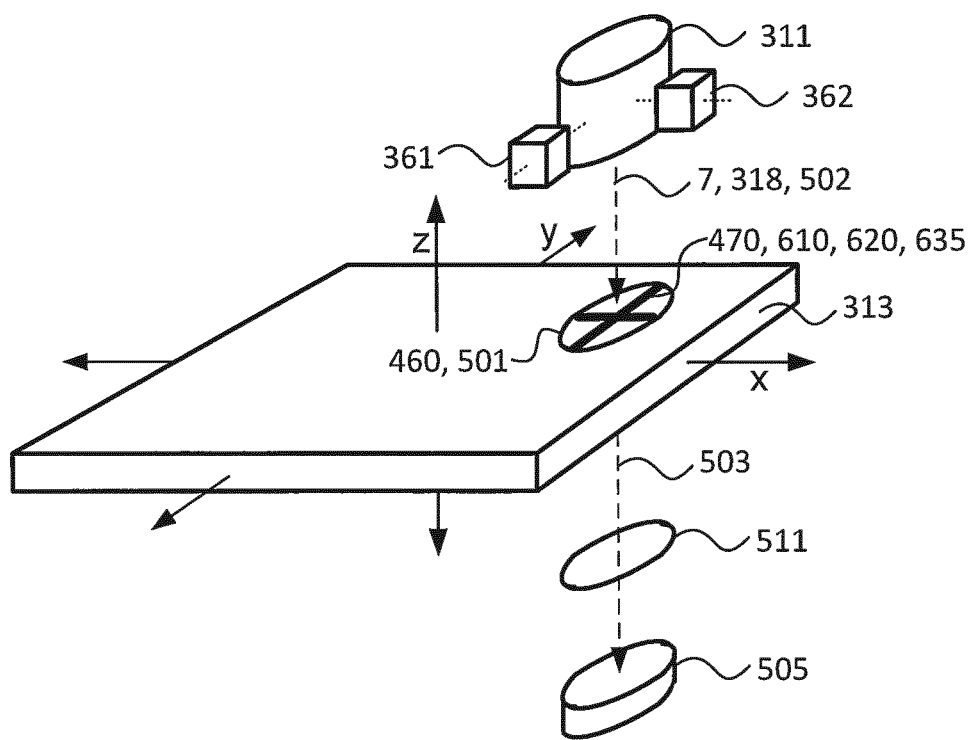
FIG. 13 shows a schematic view of an arrangement of chuck, alignment sensor, and beamlet measurement sensor.

FIG. 13 shows one arrangement of the beamlet measurement sensor 500, alignment sensors 361, 362, position mark 610, 620, 635, projection system 311, and chuck 313 as described above. In this embodiment, the surface 501 of the beamlet measurement sensor 500 and the position mark 610, 620, 635 are located in the same area of the chuck and may be combined into a single structure, e.g. the position mark 610, 620, 635 may be formed on the surface 501 of the beamlet measurement sensor 500. The surface 501 of the beamlet measurement sensor and the position mark may be fixed to a surface of the chuck, e.g. mounted directly onto the top or side surface of the chuck, or fixed using a mounting bracket to the top or side surface. The surface 501 is mounted facing towards the projection system 311, and the position mark is mounted facing at least one of the alignments sensors 361, 362.

In this embodiment, the surface 501 comprises a converter element generating photons 503 emitted from its bottom surface when struck by charged particle beams 502 at its top surface, as described earlier. The optical system 511 and photon receptor 505 are positioned below the chuck 313, and a hole is formed in the chuck 313 to permit passage of the photons 503 emitted by the converter element 501 towards the optical system 511 and photon receptor 505.

A chuck initialization procedure may be used to enable the lithography system to accurately measure movements of the chuck 313 and keep track of chuck position. Where the chuck position sensor system uses differential interferometers, such as differential interferometer 315 in FIG. 3, the system needs to be initialized in order to be able to determine the current position of the chuck 313, since such interferometers only measure relative position. Chuck initialization may be performed if certain parts of the lithography system are replaced or when an interferometer has lost its measurement signal.

The actuator system for moving the chuck 313 may have sensors or encoders to determine a rough location of the chuck 313. The initialization may begin with a coarse initialization procedure to bring the chuck 313 into a known position within sufficiently accurate limits that further chuck movement can be controlled using the measurement data from the interferometers.

Figure 14A:
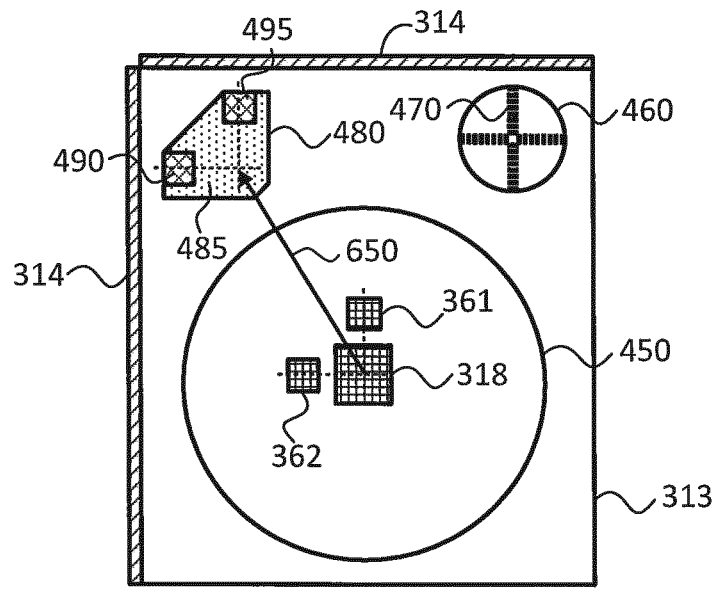
FIGS. 14a, 14b show a schematic top view of a chuck during an initialization procedure.
Figure 14B:
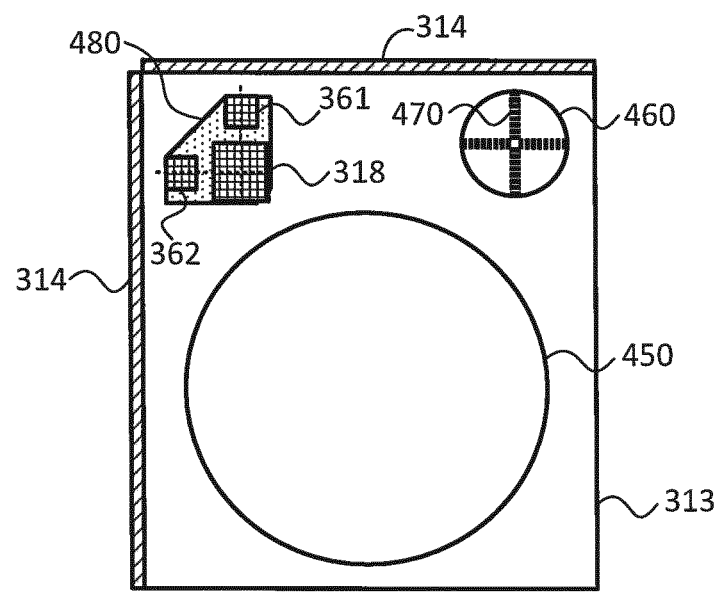

In a first step of the chuck initialization, the chuck 313, which may be positioned as shown in FIG. 14*a*, is moved (schematically shown by arrow 650) to a position underneath the alignment sensors 362, 361 so that the reference chuck position marks 490, 495 can be read by the alignment sensors 362, 361 respectively. This position is schematically shown in FIG. 14*b*.

The actuator system for moving the chuck 313 then moves the chuck 313 to obtain a best fit alignment of the reference chuck position marks 490, 495 to the alignment sensors 362, 361. For example, four mark readings may be taken of the position of the marks 490, 495, one in the x-direction and one in the y-direction for each of the two alignment sensors 362, 361, and the chuck moved in the x- and y-directions and rotated in the Rz-direction (about the z-axis) to a position minimizing the sum of the squares of the deviations in the positions of the marks 490, 495 from the positions of the alignment sensors 362, 361. This defines known x, y and Rz positions of the chuck 313 in relation to the alignment sensors 361, 362.

Preferably, in a second step. while the chuck 313 is positioned with the reference plate 480 under the alignment sensors 361, 362, a height measurement system, such as height measurement system 320 or 420 measures the distance of the alignment sensors 361, 362 to the surface 485 of the reference plate 480. Based on this height measurement, the chuck 313 may be moved in the z-direction and rotated in the Rx-direction and Ry-direction as necessary so that the reference plate surface 485 is in a predetermined plane of the height measurement system. This second step may thus define reference positions of the chuck 313 in the z-, Rx- and Ry-directions in relation to the alignment level sensors 361, 362.

Finally, measurement values related to the finally obtained position may be stored as the chuck initialization position in the x-, y-, z-, Rx-, Ry- and Rz-directions. Such stored position may be represented as coordinates [x, y, z, Rx, Ry, Rz] in it. The initialization position may be used as a starting position for the differential interferometer, and is a 6 degrees of freedom position, defining the coordinates of the chuck obtained by alignment of the reference plate 480 to the alignment sensors 361, 362 (for x, y and Rz) and preferably also to a predetermined height measurement system plane (for z, Rx and Ry).

The reproducibility of the chuck initialization position influences the reproducibility of calibrations of the metrology system of the lithography system, and it also impacts the accuracy of all other position measurements.

If a reference position on the chuck is known, for example by execution of the initialization procedure discussed with reference to FIGS. 14*a*, 14*b*, the chuck 313 may be moved to predetermined positions with reference to the initialization position. Such predetermined positions include the locations of the beamlet measurement sensor portion 460 and marks positioned therein. Furthermore, the processor unit of the lithography system has knowledge about the positions at which alignment of chuck position marks with one or more alignment sensors 361, 362 is to be expected.

Figure 15A:
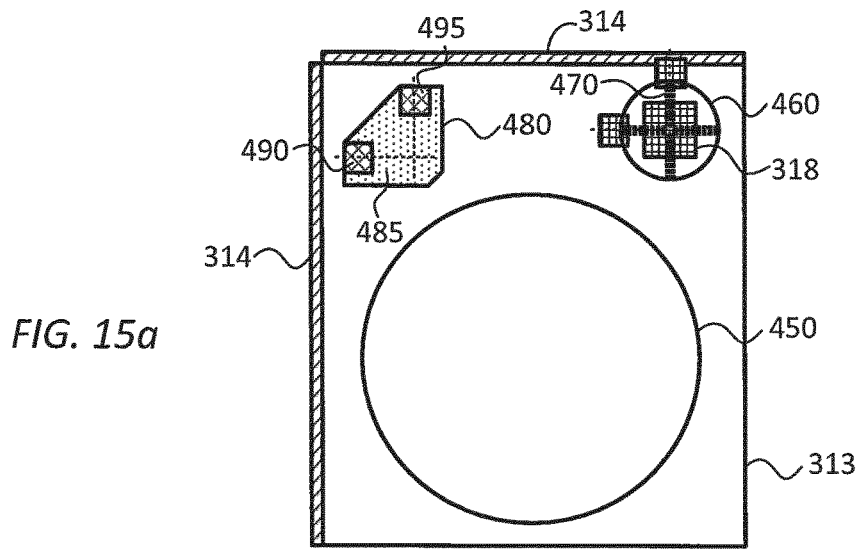
FIGS. 15a-15c show a schematic top view of a chuck during a procedure to establish a vector distance between a patterning beam and alignment sensors.

In order to obtain the relative position of the patterning beam 318 or beam grid with respect to the position mark measurement system, i.e. the alignment sensors 361, 362, in a first action, the chuck 313 may be moved to position the beamlet measurement sensor portion 460 under the beamlet projection system. The patterning beam 318, or a predetermined portion thereof, is then aligned with respect to the two-dimensional pattern of blocking structures, for example a pattern as discussed with reference to FIGS. 10*a*,10*b*, 11 and 12. The coordinates of the chuck 313 at this position, which is shown in FIG. 15*a*, is then stored as the patterning beam position, for example as a position relative to the initialization position.

Figure 15B:
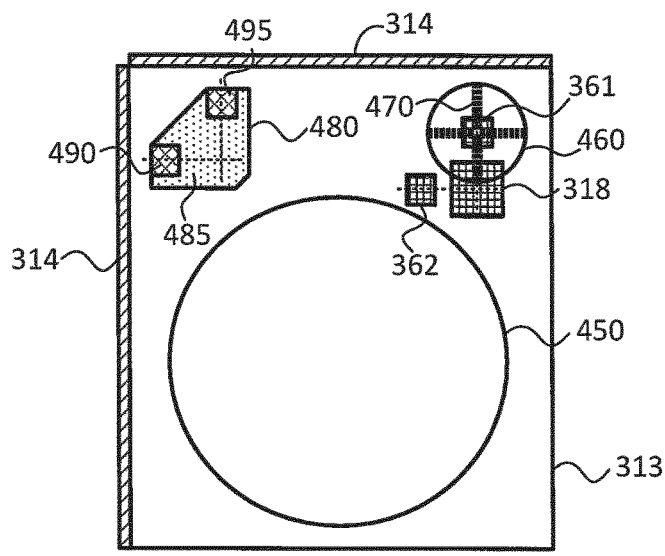

In a next step, the chuck 313 may be moved to position the chuck position mark on the beamlet measurement sensor portion 460 under the alignment sensor(s). Preferably, the chuck position mark has a predetermined spatial relationship with the two-dimensional pattern of charged particle blocking structures used to determine the patterning beam position. FIG. 15*b* shows the situation at which the chuck position mark is aligned with alignment sensor 361. The chuck position at which alignment is obtained may be stored, for example as a position relative to the initialization position.

Figure 15C:
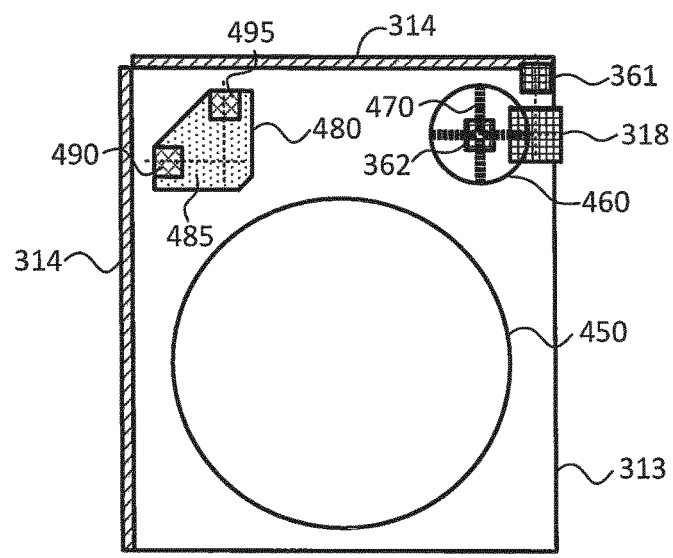

In a next step, the chuck 313 may be moved to a position at which alignment sensor 362 is coarsely aligned with respect to the chuck position mark. FIG. 15*c* shows this situation. The chuck position at which the chuck position mark is aligned with alignment sensor 362 is then obtained and stored, for example as a position relative to the initialization position.

Although the abovementioned procedure has been discussed in a specific order, first measurement of the patterning beam position, followed by measurement of an alignment position of one alignment sensor 361, which in its turn is followed by measurement of an alignment position of the other alignment sensor 362, these measurements may be taken in any order.

On the basis of the measured patterning beam position and one or both alignment positions, a relative position of the patterning beam position with respect to the alignment position of alignment sensor 361, as well as a relative position of the patterning beam position with respect to the alignment position of alignment sensor 362 can be derived. These relative positions may be calculated as vector distances. For example, a first reference position $[x_1, y_1]$ of the patterning beam (such as a geometric center of the grid of beamlets) may be determined from the measurements taken by the beamlet measurement sensor and the chuck position sensor system. A second reference position $[x_2, y_2]$ of the alignment sensor(s) may be determined from the measurements taken by the alignment sensor and the chuck position sensor system. These two reference positions may be expressed in a single coordinate system, and a vector determined between the two reference positions, e.g. vector $[x, y]_{BeamGridCenterToFirstAlignmentSensor}$ in the coordinate system.

Figure 16A:
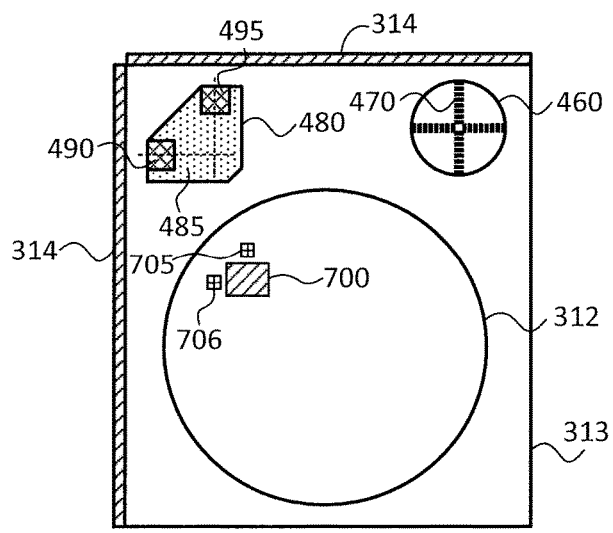
FIGS. 16a-16c show a schematic top view of a chuck during procedure to establish an exposure position on a substrate to be patterned using the vector distance established using the procedure shown in FIGS. 15a-15c.
Figure 16B:
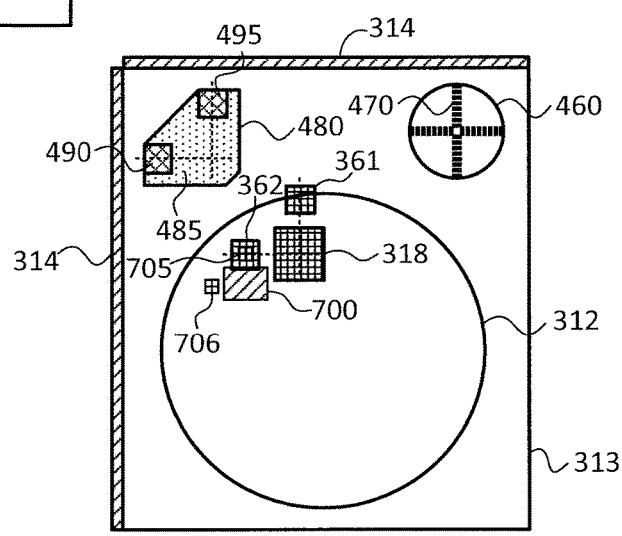
Figure 16C:
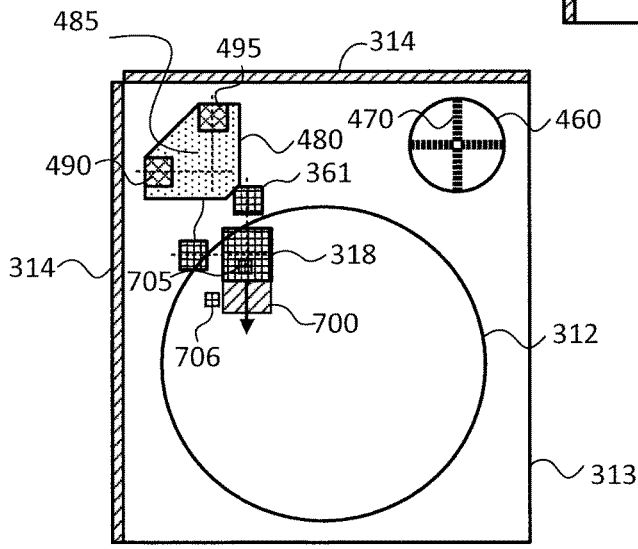

FIG. 16*a* shows a schematic top view of the chuck 313 onto which a substrate 312 to be patterned is placed within the substrate supporting portion 450 of the chuck 313. The substrate 312 is provided with a plurality of fields 700 of which only one is shown for clarity. Typically, a pattern is to be transferred onto the substrate 312 within such field 700. At predetermined positions on the substrate 312, for example around the edge of the field 700 as depicted in FIGS. 16*a*-16*c*, one or more substrate position marks 705, 706 are placed. Note that the dimensions of the field 700 and the substrate position marks 705, 706 are exaggerated as compared to the dimensions of the substrate 312 for clarity reasons.

The alignment sensors 361, 362 are now used to determine the position of the one or more substrate position marks 705, 706 and determine on the basis of these positions where the fields 700 on the substrate 312 are located, and preferably also what their orientation is. An example of such measurement is depicted in FIG. 16*b*, in which alignment sensor 361 is aligned with substrate position mark 705.

After establishing the alignment positions of the one or more substrate position marks 705, 706 on the substrate 700, the chuck 313 can be moved to a position suitable for start of a scanning movement (depicted by the arrow) to enable patterning of the field 700. The suitable position for patterning is determined on the basis of the established alignment position of the one or more substrate position marks 705, 706, the predetermined spatial relationship between the one or more substrate position marks 705, 706 and the field 700, and the relative position of the patterning beam 318 with respect to the alignment sensors 361, 362 established using the procedure discussed with reference to FIGS. 15*a*-15*c*.

The invention has been described by reference to certain embodiments discussed above. It will be recognized that these embodiments are susceptible to various modifications and alternative forms well known to those of skill in the art without departing from the scope of the invention, which is defined in the accompanying claims.

The invention claimed is:

1. A multi-beamlet charged particle beamlet lithography system for transferring a pattern to a surface of a substrate, the system comprising:
   a projection system for projecting a plurality of charged particle beamlets onto the surface of the substrate;
   a chuck moveable with respect to the projection system;
   a beamlet measurement sensor for determining one or more characteristics of one or more of the charged particle beamlets, the beamlet measurement sensor having a surface for receiving one or more of the charged particle beamlets, wherein the surface of the beamlet measurement sensor comprises a converter element for receiving charged particles and generating photons in response; and a position mark measurement system for measuring a position of the chuck, the position mark measurement system comprising a position mark and an alignment sensor;

wherein the chuck comprises a substrate support portion for supporting the substrate, a beamlet measurement sensor portion for accommodating the surface of the beamlet measurement sensor, and a position mark portion for accommodating the position mark.

2. System according to claim 1, wherein the surface of the beamlet measurement sensor is characterised by at least one of:

having a predetermined spatial relationship with the position mark;

having a predetermined spatial relationship with the position mark and being combined with the position mark into a single structure;

having a predetermined spatial relationship with the position mark and being combined with the position mark into a single structure, wherein the position mark is formed on the surface of the beamlet measurement sensor; and being fixed to a surface of the chuck, the position mark also fixed to the surface of the chuck.

3. System according to claim 1, wherein the alignment sensor comprises a light source for illuminating the position mark and a detector for detecting light that has interacted by reflection with the position mark.

4. System according to claim 1, wherein the surface of the beamlet measurement sensor is characterised by at least one of:

being provided with a predetermined pattern of one or more charged particle blocking structures forming one or more knife edges at transitions between blocking and non-blocking regions;

being provided with a predetermined pattern of one or more charged particle blocking structures forming one or more knife edges at transitions between blocking and non-blocking regions, wherein the predetermined pattern of one or more charged particle blocking structures has a predetermined spatial relationship with the position mark;

being provided with a predetermined pattern of one or more charged particle blocking structures forming one or more knife edges at transitions between blocking and non-blocking regions and further being provided with a predetermined pattern of light blocking structures forming the position mark;

being provided with a predetermined pattern of one or more charged particle blocking structures forming one or more knife edges at transitions between blocking and non-blocking regions, wherein the predetermined pattern of one or more charged particle blocking structures forms the position mark;

being provided with a predetermined pattern of one or more charged particle blocking structures forming one or more knife edges at transitions between blocking and non-blocking regions, wherein the predetermined pattern of one or more charged particle blocking structures comprises a plurality of blocking structures positioned at a pitch corresponding to an expected distance between adjacent charged particle beamlets at the substrate surface.

5. System according to claim 4, wherein a geometric center of the predetermined pattern of one or more charged particle blocking structures coincides with the center of the position mark.

6. System according to claim 4, wherein the one or more charged particle blocking structures are substantially circular blocking structures.

7. System according to claim 1, wherein the position mark measurement system comprises a first alignment sensor for determining a position of the position mark in a first direction and a second alignment sensor for determining a position of the position mark in a second direction, the second direction being substantially perpendicular to the first direction.

8. System according to claim 1, wherein the position mark comprises a periodic structure in a first direction, and a periodic structure in a second direction, the second direction being substantially perpendicular to the first direction.

9. System according to claim 8, wherein the periodic structures are formed by periodically spaced elevated structures.

10. System according to claim 8, wherein the periodic structures are formed by regions with a first reflectivity coefficient alternating with regions with a second reflectivity coefficient, the second reflectivity coefficient being different from the first reflectivity coefficient.

11. System according to claim 1, wherein the projection system comprises a beamlet generator for generating the plurality of charged particle beamlets, and a modulation system for modulating the charged particle beamlets in accordance with a pattern to be transferred to the surface of the substrate, wherein the projection system is arranged for projecting the modulated beamlets onto the surface of the substrate.

12. System according to claim 1, further comprising a chuck position measuring system and a control unit, wherein:

the control unit is arranged to control the chuck to be moved to a first position at which one or more of the charged particle beamlets are received by the surface of the beamlet measurement sensor;

the control unit is arranged to receive information about measurement of one or more characteristics of the one or more charged particle beamlets received by the surface of the beamlet measurement sensor;

the chuck position measuring system is arranged to measure position of the chuck in the first position to determine a first measured chuck position;

the control unit is arranged to control the chuck to be moved to a second position at which the position mark is aligned with the alignment sensor;

the chuck position measuring system is arranged to measure position of the chuck in the second position to determine a second measured chuck position; and the control unit is arranged to calculate a relative position between the one or more charged particle beamlets and the alignment sensor on the basis of the measurement of the one or more characteristics of the one or more charged particle beamlets, the first measured chuck position, and the second measured chuck position.

13. System according to claim 12, wherein:

the control unit is further arranged to control the chuck to be moved, the chuck having a substrate placed on the substrate supporting portion of the chuck, to a third position at which a substrate position mark on the substrate is aligned with the alignment sensor; and the chuck position measuring system is further arranged to measure position of the chuck in the third position to determine a third measured chuck position.

14. System according to claim 13, wherein the control unit is further arranged to control the chuck to be moved to a fourth position at which one or more of the charged particle beamlets expose a desired portion of the substrate to be exposed, the fourth position being determined on the basis of the measurement of the one or more characteristics of the one or more charged particle beamlets and the first, second and third measured chuck positions.

15. A method for operating a multi-beam charged particle lithography system for transferring a pattern to a surface of a substrate, the method comprising:
 moving a chuck, which is moveable with respect to a projection system of the lithography system and comprising a substrate support portion for supporting the substrate, a beamlet measurement sensor portion for accommodating a surface of a beamlet measurement sensor, and a position mark portion for accommodating a position mark, to a first position at which one or more charged particle beamlets projected from the projection system are received by the surface of the beamlet measurement sensor;
 measuring one or more characteristics of the one or more charged particle beamlets received by the surface of the beamlet measurement sensor, the surface of the beamlet measurement sensor comprising a converter element for receiving charged particles and generating photons in response;
 measuring, using a position mark measurement system of the lithography system, position of the chuck in the first position to determine a first measured chuck position, the position mark measurement system comprising the position mark and an alignment sensor;
 moving the chuck to a second position at which the position mark is aligned with the alignment sensor;
 measuring, using the position mark measurement system, the position of the chuck in the second position to determine a second measured chuck position; and
 calculating a relative position between the one or more charged particle beamlets and the alignment sensor on the basis of the measurement of the one or more characteristics of the one or more charged particle beamlets, the first measured chuck position, and the second measured chuck position.

16. Method according to claim 15, wherein calculating the relative position between the one or more charged particle beamlets and the alignment sensor comprises calculating a vector distance between a reference point of the one or more charged particle beamlets and a reference point of the alignment sensor.

17. Method according to claim 15, further comprising:
 placing a substrate on the substrate supporting portion of the chuck;
 moving the chuck to a third position at which a substrate position mark on the substrate is aligned with the alignment sensor; and
 measuring the position of the chuck in the third position to determine a third measured chuck position.

18. Method according to claim 17, further comprising moving the chuck to a fourth position at which one or more of the charged particle beamlets expose a desired portion of the substrate to be exposed, the fourth position being determined on the basis of the measurement of the one or more characteristics of the one or more charged particle beamlets and the first, second and third measured chuck positions.

* * * * *